(12) United States Patent
Sills et al.

(10) Patent No.: US 8,900,963 B2
(45) Date of Patent: Dec. 2, 2014

(54) METHODS OF FORMING SEMICONDUCTOR DEVICE STRUCTURES, AND RELATED STRUCTURES

(75) Inventors: Scott E. Sills, Boise, ID (US); Dan B. Millward, Boise, ID (US)

(73) Assignee: Micron Technology, Inc., Boise, ID (US)

(*) Notice: Subject to any disclaimer, the term of this patent is extended or adjusted under 35 U.S.C. 154(b) by 314 days.

(21) Appl. No.: 13/287,814

(22) Filed: Nov. 2, 2011

(65) Prior Publication Data

US 2013/0105755 A1    May 2, 2013

(51) Int. Cl.
*H01L 21/20* (2006.01)
*H01L 45/00* (2006.01)

(52) U.S. Cl.
CPC .......... *H01L 45/1233* (2013.01); *H01L 45/145* (2013.01); *H01L 45/085* (2013.01); *H01L 45/1683* (2013.01); *H01L 45/141* (2013.01); *H01L 45/1658* (2013.01); *H01L 45/146* (2013.01)
USPC ............. 438/381; 438/23; 257/2; 257/E21.52

(58) Field of Classification Search
CPC ........ C08F 10/00; C08F 8/42; C08L 2666/02; C08L 53/00; H01L 21/02118; H01L 21/31058; H01L 51/0002; H01L 51/0034; H01L 51/0043; H01L 45/1658; H01L 45/085
USPC .................. 438/23, 50, 381; 257/2, E45.002, 257/E21.52
See application file for complete search history.

(56) References Cited

U.S. PATENT DOCUMENTS

| | | | |
|---|---|---|---|
| 4,623,674 A | 11/1986 | Bailey | |
| 4,797,357 A | 1/1989 | Mura et al. | |
| 4,818,713 A | 4/1989 | Feygenson | |
| 4,877,647 A | 10/1989 | Klabunde | |
| 5,328,810 A | 7/1994 | Lowrey et al. | |
| 5,374,367 A | 12/1994 | Edamura et al. | |
| 5,382,373 A | 1/1995 | Carlson | |
| 5,482,656 A | 1/1996 | Hiraoka et al. | |
| 5,512,131 A | 4/1996 | Kumar et al. | |

(Continued)

FOREIGN PATENT DOCUMENTS

| | | |
|---|---|---|
| CN | 1562730 A | 1/2005 |
| CN | 1799131 A | 7/2006 |

(Continued)

OTHER PUBLICATIONS

Huang et al., "Stretchable gold conductors on elastomeric substrates," Applied Physics Letters, vol. 82, No. 15, Apr. 14, 2003, pp. 2404-2406.

(Continued)

*Primary Examiner* — Colleen A Matthews
*Assistant Examiner* — Colleen E Snow
(74) *Attorney, Agent, or Firm* — TraskBritt

(57) ABSTRACT

A method of forming a semiconductor device structure. The method comprises forming a block copolymer assembly comprising at least two different domains over an electrode. At least one metal precursor is selectively coupled to the block copolymer assembly to form a metal-complexed block copolymer assembly comprising at least one metal-complexed domain and at least one non-metal-complexed domain. The metal-complexed block copolymer assembly is annealed in to form at least one metal structure. Other methods of forming a semiconductor device structures are described. Semiconductor device structures are also described.

30 Claims, 18 Drawing Sheets

(56) References Cited

U.S. PATENT DOCUMENTS

| | | | |
|---|---|---|---|
| 5,538,655 A | 7/1996 | Fauteux et al. |
| 5,580,700 A | 12/1996 | Rahman |
| 5,620,850 A | 4/1997 | Bamdad et al. |
| 5,622,668 A | 4/1997 | Thomas et al. |
| 5,772,905 A | 6/1998 | Chou |
| 5,834,583 A | 11/1998 | Hancock et al. |
| 5,849,810 A | 12/1998 | Muller et al. |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh et al. |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wimsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,114,306 B2 | 2/2012 | Cheng et al. |
| 8,206,601 B2 * | 6/2012 | Bosworth et al. ............... 216/11 |
| 8,287,749 B2 * | 10/2012 | Hasegawa et al. ............ 216/41 |

(56) References Cited

U.S. PATENT DOCUMENTS

| | | |
|---|---|---|
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | De Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |

(56) References Cited

U.S. PATENT DOCUMENTS

| | | |
|---|---|---|
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0122292 A1* | 5/2012 | Sandhu et al. ............... 438/382 |
| 2012/0133017 A1 | 5/2012 | Millward et al. |
| 2012/0135159 A1* | 5/2012 | Xiao et al. ............... 427/534 |
| 2012/0164389 A1* | 6/2012 | Yang et al. ............... 428/172 |
| 2012/0211871 A1* | 8/2012 | Russell et al. ............... 257/618 |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 | 4/2000 |
| EP | 1416303 A2 | 5/2004 |
| EP | 1906237 | 2/2008 |
| EP | 1593164 B1 | 6/2010 |
| JP | 11080414 A | 3/1999 |
| JP | 2003155365 | 5/2003 |
| JP | 2004335962 | 11/2004 |
| JP | 2005008882 A | 1/2005 |
| JP | 2005029779 | 3/2005 |
| JP | 2006036923 A | 2/2006 |
| JP | 2006055982 A | 3/2006 |
| JP | 2006110434 | 4/2006 |
| JP | 2007194175 | 8/2007 |
| JP | 2008036491 A | 2/2008 |
| KR | 1020060128378 | 12/2006 |
| KR | 20070029762 | 3/2007 |
| KR | 100771886 B1 | 11/2007 |
| TW | 200400990 | 3/1992 |
| TW | 200633925 | 10/1994 |
| TW | 200740602 | 1/1996 |
| TW | 584670 B | 4/2004 |
| TW | 200419017 | 10/2004 |
| TW | 200511364 | 3/2005 |
| TW | 256110 | 6/2006 |
| TW | 1253456 | 11/2007 |
| TW | 200802421 | 1/2008 |
| WO | 9007575 | 7/1990 |
| WO | 9706013 A1 | 2/1997 |
| WO | 9839645 A1 | 9/1998 |
| WO | 9947570 A1 | 9/1999 |
| WO | 0031183 A1 | 6/2000 |
| WO | 0218080 | 3/2002 |
| WO | 02081372 A2 | 10/2002 |
| WO | 03045840 | 6/2003 |
| WO | 2005122285 A2 | 12/2005 |
| WO | 2006003592 | 1/2006 |
| WO | 2006003594 | 1/2006 |
| WO | 2006076016 A2 | 7/2006 |
| WO | 2006078952 A1 | 7/2006 |
| WO | 2006112887 | 10/2006 |
| WO | 2007001294 A1 | 1/2007 |
| WO | 2007013889 A2 | 2/2007 |
| WO | 2007024241 A2 | 3/2007 |
| WO | 2007024323 A2 | 3/2007 |
| WO | 2007019439 A3 | 5/2007 |
| WO | 2007055041 A1 | 5/2007 |
| WO | 2008055137 | 5/2008 |
| WO | 2008091741 A2 | 7/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Hutchison, J. B, et al., "Polymerizable Living Free Radical Initiators as a Platform to Synthesize Functional Networks," Chem. Mater., vol. 17, No. 19, 2005, pp. 4789-4797.

Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.

In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. Of Wisconsin-Madison, pp. 7855-7860.

Ji, Shengxiang, et al., "Generalization of the Use of Random Copolymers to Control the Wetting Behaviors of Block Copolymer Films," Macromolecules, 2008, 41(23): 9098-9103.

Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.

Jun, Y., et al., "Microcontact Printing Directly on the Silicon Surface," Langmuir, 2002, 18(9), pp. 3415-3417, Abstract only.

Karim, Alamgir, et al., "Control of Ordering Kinetics and Morphology Using Zone Annealing of Thin Block Copolymer Films", Abstract submitted for the Mar. 2007 Meeting of The American Physical Society, Nov. 20, 2006.

Kim, Sang Ouk, et al., "Novel Complex Nanostructure from Directed Assembly of Block Copolymers on Incommensurate Surface Patterns," Adv. Mater., 2007, 19, pp. 3271-3275.

Kim, Seung Hyun, et al., "Highly Oriented and Ordered Arrays from Block Copolymers via Solvent Evaporation," Adv. Mater. 2004, 16, No. 3, Feb. 3, pp. 226-231.

Kim, Seung Hyun, et al., "Salt Complexation in Block Copolymer Thin Films," Macromolecules 2006, vol. 39, No. 24, 2006, pp. 8473-8479.

Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.

Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.

Kim, SH, et al., "Synthesis and characterization of Dextran-methacrylate Hydrogels and Structural Study by SEM," J Biomater Res., Mar. 15, 2000; 49(4): 517-27 Abstract only.

Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, © 2008 American Vacuum Society, pp. 189-194.

Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.

(56) References Cited

OTHER PUBLICATIONS

Krishnamoorthy et al., Nonopatterned Self-Assembled Monolayers by Using Diblock Copolymer Micelles as nanometer-Scale Adsorption and Etch Masks, Advanced Materials, 2008, pp. 1-4.

Krishnamoorthy, S., et al., "Nanoscale Patterning with Block Copolymers," Materials Today, vol. 9, No. 9, Sep. 2006, pp. 40-47.

Kuhnline et al., "Detecting thiols in a microchip device using micromolded carbon ink electrodes modified with cobalt phthalocyanine", Analyst, vol. 131, pp. 202-207, (2006).

La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.

La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.

Laracuente, A.R., et al., "Step Structure and Surface Morphology of Hydrogen-terminated Silicon: (001) to (114)," Surface Science 545, 2003, pp. 70-84.

Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.

Li, Mingqi, et al., "Block Copolymer Patterns and Templates," Materials Today, vol. 9, No. 9, Sep. 2006, pp. 30-39.

Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.

Li, Xue, et al., "Morphology Change of Asymmetric Diblock Copolymer Micellar Films During Solvent Annealing," ScienceDirect, Polymer 48 (2007), pp. 2434-2443.

Lin, Zhiqun, et al., "A Rapid Route to Arrays of Nanostructures in Thin Films," Adv. Mater. 2002, 14 No. 19, Oct. 2, pp. 1373-1376.

Lin-Gibson, Sheng, et al., "Structure—Property Relationships of Photopolymerizable Poly(ethylene glycol) Dimethacrylate Hydrogels," Macromolecules 2005, 38, American Chemical Society, pp. 2897-2902.

Lutolf, M., et al., "Cell-Responsive Synthetic Hydrogels," Adv. Mater., vol. 15, No. 11, Jun. 2003, pp. 888-892.

Lutolf, M.P., et al, "Synthetic Biomaterials as Instructive Extracellular Microenvironments for Morphogenesis in Tissue Engineering," Nature Biotechnology, 23, 47-55 (2005), Abstract only.

Malkoch, M., et al., "Synthesis of Well-defined Hydrogel Networks Using Click Chemistry," Chem. Commun., 2006, The Royal Society of Chemistry, pp. 2774-2776.

Mansky, P., et al., "Controlling Polymer-Surface Interactions with Random Copolymer Brushes," Science, vol. 275, Mar. 7, 1997, pp. 1458-1460.

Martens, P., et al., "Characterization of Hydrogels Formed from Acrylate Modified Poly(vinyl alcohol) Macromers," Polymer, Vol. 41, Issue 21, Oct. 2000, pp. 7715-7722, Abstract only.

Matsuda, T., et al., "Photoinduced Prevention of Tissue Adhesion," Asaio J, Jul.-Sep. 1992; 38(3): M154-7, Abstract only.

Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.

Metters, A., et al., "Network Formation and Degradation Behavior of Hydrogels Formed by Michael-Type Addition Reactions," Biomacromolecules 2005, 6, 2005, pp. 290-301.

Meyer, E., et al., "Controlled Dewetting Processes on Microstructured Surfaces—a New Procedure for Thin Film Microstructuring," Macromollecular Mater. Eng., 276/277, 2000, Institute of Polymer Research Dresden, pp. 44-50.

Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.

Mindel, J., et.al., "A Study of Bredig Platinum Sols", The Chemical Laboratories of New York University, received Jun. 10, 1943, vol. 65 pp. 2112.

Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.

Nealey, P. F., et al., "Self-Assembling Resists for Nanolithography", IProceedings of the IEEE International Electron Devices Meeting, IEDM Technical Digest, 356-359 (2005).

Nguyen, K. T., et al., "Photopolymerizable Hydrogels for Tissue Engineering Applications," Biomaterials 23, 2002, pp. 4307-4314.

Nishikubo, T., "Chemical Modification of Polymers via a Phase-Transfer Catalyst or Organic Strong Base," American Chemical Society Symposium Series, 1997, American Chemical Society, pp. 214-230.

Niu, Sanjun, et al., "Stability of Order in Solvent-Annealed Block Copolymer Thin Films," Macromolecules, vol. 36, No. 7, 2003, Univ. of Nebraska, USA, pp. 2428-2440, (web release date: Mar. 13, 2003) (http://digitalcommons.uni.edu/cgi/viewcontent.cgi?article+1005 &contect=chemeng_nanotechnology).

Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.

Parejo, P. G., et al., "Highly Efficient UV-absorbing Thin-film Coatings for Protection of Organic Materials Against Photodegradation," J. Mater. Chem, 2006, 16, The Royal Society of Chemistry, pp. 2165-2169.

Park et al., High-Aspect-Ratio Cylindrical Nanopore Arrays and Their Use for Templating Titania Nanoposts, Advanced Materials, vol. 20, pp. 738-742, 2008.

Park, Cheolmin, et al., "Enabling Nanotechnology with Self Assembled Block Copolymer Patterns," Polymer 44, 2003, pp. 6725-6760.

Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing LTD, UK, pp. 1-7.

Park, M., et al., "Block Copolymer Lithography: Periodic Arrays of 1011 Holes in 1 Square Centimeter," Science, vol. 276, No. 5317, May 30, 1997, pp. 1401-1404.

Electronegativity—<http://www.princeton.edu/~achaney/tmve/wiki100k/docs/Electronegativity.html> website, visited Aug. 28, 2013, 1 page.

Kim et al., Self-assembled Hydrogel Nanoparticles Composed of Dextran and Poly (ethylene glycol) Macromer, Int J Pharm., vol. 205, No. 1-2, (Sep. 15, 2000), pp. 109-116, abstract only.

Xiao et al., Graphoepitaxy of Cylinder-forming Block Copolymers for Use as Templates to Pattern Magnetic Metal Dot Arrays, Nanotechnology 16, IPO Publishing Ltd, UK (2005), pp. S324-S329.

Ali, H. A., et al., Properties of Self-assembled ZnO Nanostructures, Solid-State Electronics 46 (2002), 1639-1642.

Bae, Joonwon, "Surface Modification Using Photo-Crosslinkable Random Copolymers", Abstract submitted for the Mar. 2006 meeting of The American Physical Society, submitted Nov. 30, 2005. (Accessed via the Internet [retrieved on Apr. 5, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., "The Effect of Humidity on the Ordering of Tri-block Copolymer Thin Films," Abstract submitted for the Mar. 2007 meeting of The American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, (published online Mar. 23, 2003).

(56) References Cited

OTHER PUBLICATIONS

Berry, B. C., et al., "Orientational Order in Block Copolymer Films Zone Annealed Below the Order-Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Berry, B. C., et al., "Effects of Zone Annealing on Thin Films of Block Copolymers", National Institute of Standard and Technology, Polymers Division, Maryland, USA, 2007, 2 pages.

Black, C.T., et al., "Integration of Self Assembly for Semiconductor Microelectronics," IEEE 2005 Custom Integrated Circuits Conference, IBM T.J. Watson Research Center, pp. 87-91.

Black, C. T., "Polymer Self-Assembly as a Novel Extension to Optical Lithography," ACSNano, vol. 1, No. 3, 2007, American Chemical Society, pp. 147-150.

Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.

Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).

Black, C. T., et al., Polymer Self Assembly in Semiconductor Microelectronics, IBM J. Res. & Dev. vol. 51, No. 5, Sep. 2007, pp. 605-633.

Botelho Do Rego, A. M, et al., "Diblock Copolymer Ultrathin Films Studied by High Resolution Electron Energy Loss Spectroscopy," Surface Science, 482-485 (2001), pp. 1228-1234.

Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, P., et al., "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Published online Aug. 13, 1999, Abstract only.

Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).

Candau, F., et al., "Synthesis and Characterization of Polystyrene-poly(ethylene oxide) Graft Copolymers," Polymer, 1977, vol. 18, pp. 1253-1257.

Cavicchi, K. A., et al., "Solvent Annealed Thin Films of Asymmetric Polyisoprene-Polylactide Diblock Copolymers," Macromolecules 2007, vol. 40, 2007, Univ. of Massachusetts, pp. 1181-1186.

Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Chang, Li-Wen, "Diblock Copolymer Directed Self-Assembly for CMOS Device Fabrication," Proc. of SPIE, vol. 6156, 2006, 615611-1 to 615611-6.

Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.

Cheng, J. Y., et al., "Rapid Directed Self Assembly of Lamellar Microdomains from a Block Copolymer Containing Hybrid," Applied Physics Letters, 91, 143106-143106-3 (2007).

Cheng, J. Y., et al., "Self-Assembled One-Dimensional Nanostructure Arrays," Nano Letters, vol. 6, No. 9, 2006, pp. 2099-2103.

Cheng, J.Y., et al., "Templated Self-Assembly of Block Copolymers: Effect of Substrate Topography," Adv. Mater. 2003, vol. 15, No. 19, pp. 1599-1602.

Choi, H. J., et al., "Magnetorheology of Synthesized Core-Shell Structured Nanoparticle," IEEE Transactions on Magnetics, vol. 41, No. 10, Oct. 2005, pp. 3448-3450.

Daoulas Kostas CH., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-3.

Darling, S. B., "Directing the Self-assembly of Block Copolymers," Progress in Polymer Science, vol. 32, No. 10, Sep. 28, 2007, pp. 1152-1204.

Desai, Dr. Trejal A., et al., "Engineered Silicon Surfaces for Biomimetic Interfaces," Business Briefing: Medical Device Manufacturing & Technology, 2002.

Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.

Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.

Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.

Fasolka, M. J. et al., "Morphology of Ultrathin Supported Diblock Copolymer Films: Theory and Experiment," Macromolecules 2000, vol. 33, No. 15, pp. 5702-5712.

Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.

Gates, B. D., et al., "Unconventional Nanofabrication," Annu. Rev. Mater. Res. 2004, 34:339-72.

Ge, Zhenbin, et al., "Thermal Conductance of Hydrophilic and Hydrophobic Interfaces," PRL 96, 186101-1-186101-4, The American Physical Society, week ending May 12, 2006.

Gelest Inc., "Silane Coupling Agents: Connecting Across Boundaries," v2.0, 2006, pp. 1-56.

Genua, A., et al., "Functional Patterns Obtained by Nanoimprinting Lithography and Subsequent Growth of Polymer Brushes," Nanotechnology, 18, (2007), IOP Publishing Ltd., pp. 1-7.

Gillmor, S. D., et al., "Hydrophilic/Hydrophobic Patterned Surfaces as Templates for DNA Arrays," Langmuir 2000, vol. 16, No. 18, 2000, pp. 7223-7228.

Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.

Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, 2005 Wiley Periodicals, Inc., pp. 3932-3944.

Hamley, I. W., "Introduction to Block Copolymers", Developments in Block Copolymers Science and Technology, John Wiley & Sons, Ltd., 2004, pp. 1-29.

Hammond, M. R., et al., "Temperature Dependence of Order, Disorder, and Defects in Laterally Confined Diblock Copolymer Cylinder Monolayers," Macromolecules, vol. 38, Jul. 2005; American Chemical Society, p. 6575-6585.

Harrison, C., et al., "Layer by Layer Imaging of Diblock Copolymer Films with a Scanning Electron Microscope," Polymer, vol. 39, No. 13, 1998, pp. 2733-2744.

Hawker, C. J., et al., "Facile Synthesis of Block Copolymers for Nanolithographic Applications," Polymer Reprints, American Chemical Society (2005).

Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.

(56) References Cited

OTHER PUBLICATIONS

He et al., "Self-Assembly of Block Copolymer Micelles in an Ionic Liquid," J. Am. Chem. Soc. 2006, 128, pp. 2745-2750.
Helmbold, A., et al., "Optical Absorption of Amorphous Hydrogenated Carbon Thin Films," Thin Solid Films 283 (1996) pp. 196-203.
Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.
Park, Seung Hak, et al., "Block Copolymer Multiple Patterning Integrated with Conventional ArF Lithography," Soft Matter, 2010, 6, Royal Society of chemistry, pp. 120-125.
Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.
Peng, J., et. al., "Development of Nanodomain and Fractal Morphologies in Solvent Annealed Block copolymer Thin Films," Macromol. Rapid Commun. 2007, 28, pp. 1422-1428.
Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.
Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.
Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.
Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.
Rogers, J. A., "Slice and Dice, Peel and Stick: Emerging Methods for Nanostructure Fabrication," ACS Nano, vol. 1, No. 3, 2007, pp. 151-153.
Ruiz, R., et al., "Density Multiplication and Improved Lithography by Directed Block Copolymer Assembly," Science, vol. 321, Aug. 15, 2008, pp. 936-939.
Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.
Sang et al., "Epitaxial self-assembly of block copolymers on lithographically defined nanopatterned substrates", Nature, vol. 24, pp. 411-414, (Jul. 2003).
Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.
Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.
Segalman, R. A., "Patterning with Block Copolymer Thin Films," Materials Science and Engineering R 48 (2005), Elsevier B. V., pp. 191-226.
Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.
Sharma, S. et al., "Ultrathin Poly(ethylene glycol) Films for Silicon-based Microdevices," Applied Surface Science, 206 (2003), Elsevier Science B.V., pp. 218-229.
Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Sivaniah, E., et al., "Observation of Perpendicular Orientation in Symmetric Diblock Copolymer Thin Films on Rough Substrates," Macromolecules 2003, 36, American Chemical Society, pp. 5894-5896.
Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.
Solak, H. H., "Nanolithography with Coherent Extreme Ultraviolet Light," Journal of Physics D: Applied Physics, 2006, IOP Publishing Ltd., UK, pp. R171-188.
Srinvivasan, C., et al., "Scanning Electron Microscopy of Nanoscale Chemical Patterns," ACS Nano, vol. 1, No. 3, pp. 191-201, 2007.
Stoykovich, M. P., et al., "Directed Assembly of Block Copolymer Blends into Nonregular Device-Oriented Structures," Science, vol. 308, Jun. 3, 2005, pp. 1442-1446.
Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.
Sundrani, D., et al., "Guiding Polymers to Perfection: Macroscopic Alignment of Nanoscale Domains," Nano Lett., vol. 4, No. 2, 2004, American Chemical Society, pp. 273-276.
Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.
Tang et al., Evolution of Block Copolymer Lithography to Highly Ordered Square Arrays, Science, vol. 322, No. 5900, Sep. 25, 2008, pp. 429-432.
Trimbach et al., "Block Copolymer Thermoplastic Elastomers for Microcontact Printing," Langmuir, 2003, vol. 19, p. 10957.
Truskett, V. M., et. al., "Trends in Imprint Lithography for Biological Applications," TRENDS in Biotechnology, vol. 24, No. 7, Jul. 2006, pp. 312-315.
Tseng et al., Enhanced Block Copolymer Lithography Using Sequential Infiltration Synthesis, The Journal of Physical Chemistry, vol. 115, No. 36, Sep. 15, 2011, 15 pages.
Van Poll, M. L., et al., "a Self-Assembly Approach to Chemical Micropatterning of Poly(dimethylsiloxane)," Angew. Chem. Int. Ed. 2007, 46, pp. 6634-6637.
Wang, C., et al., "One Step Fabrication and characterization of Platinum Nanopore Electrode Ensembles formed via Amphiphilic Block Copolymer Self-assembly," Electrochimica Acta 52 (2006), pp. 704-709.
Wathier, M., et al., "Dendritic Macromers as in Situ Polymerizing Biomaterials for Securing Cataract Incisions," J. Am. Chem. Soc., 2004, 126 (40), pp. 12744-12745, Abstract only.
Winesett, D.A., et al., "Tuning Substrate Surface Energies for Blends of Polystyrene and Poly(methyl methacrylate)," Langmuir 2003, 19, American Chemical Society, pp. 8526-8535.
WIPF, "Handbook of Reagents for Organic Synthesis", 2005, John Wiley & Sons Ltd., p. 320.
Wu, C.Y., et al., "Self-Assembled Two-Dimensional Block Copolymers on Pre-patterned Templates with Laser Interference Lithography," IEEE, 2007, pp. 153-154.
Xu, Ting, et al., "The Influence of Molecular Weight on Nanoporous Polymer Films," Polymer 42, Elsevier Science Ltd., (2001) pp. 9091-9095.
Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.
Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.
Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.

(56) References Cited

OTHER PUBLICATIONS

Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.
Yurt, Serkan, et al., "Scission of Diblock Copolymers into Their Constituent Blocks," Macromolecules 2006, vol. 39, No. 5, 2006, American Chemical Society, pp. 1670-1672.
Zhang, Mingfu, et al., "Highly Ordered Nanoporous Thin Films from Cleavable Polystyrene-block-poly(ethylene oxide),"Adv. Mater. 2007, 19, pp. 1571-1576.
Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.
Arshady et al., The Introduction of Chloromethyl Groups into Styrene-based Polymers, 1, Makromol. Chem., vol. 177, 1976, p. 2911-2918.
Xu et al., Electric Field Alignment of Symmetric Diblock Copolymer Thin Films, Department of Polymer Science and Engineering, University of Massachusetts, 5 pages (2003).
Xu et al., Interfacial Interaction Dependence of Microdomain Orientation in Diblock Copolymer Thin Films, Macromolecules, vol. 38, pp. 2802-2805 (2005).
Xu, F.J., et al., "Surface-Initiated Atom Transfer Radical Polymerization from Halogen-Terminated Si(111) (Si-X, X=Cl, Br) Surfaces for the Preparation of Well-Defined Polymer-Si Hybrids," Langmuir, vol. 21, No. 8, pp. 3221-3225, 2005.
Yamaguchi et al., Resist-Pattern Guided Self-Assembly of Symmetric Diblock Copolymer, Journal of Photopolymer Science and Technology, vol. 19, No. 3, pp. 385-388 (2006).
Yang et al., Covalently Attached Graft Polymer Monolayer on Organic Polymeric Substrate via Confined Surface Inhibition Reaction, Journal of Polymer Science-A—Polymer Chemistry Edition, Sep. 28, 2006, pp. 745-755, vol. 45, Issue 5.
Yu et al., Contact Printing Beyond Surface Roughness: Liquid Supramolecular Nanostamping, Advanced Materials, vol. 19, 2007, pp. 4338-4342.
Zaumseil et al., "Three-Dimensional and Multilayer Nanostructures Formed by Nanotransfer Printing," Nano Letters, 2003, vol. 3, No. 9, pp. 1223-1227.
Zehner, Robert W., et al., "Selective Decoration of a Phase-Separated Diblock Copolymer with Thiol-Passivated Gold Nanocrystals," Langmuir, vol. 14, No. 2, pp. 241-243, Jan. 20, 1998.
Zhang et al., "Self-Assembled Monolayers of Terminal Alkynes on Gold," J. Am. Chem. Soc., vol. 129, No. 16, pp. 4876-4877, 2007.
Zhao et al., Colloidal Subwavelength Nanostructures for Antireflection Optical Coatings, Optics Letters, vol. 30, No. 14, pp. 1885-1887 (2005).
Zhou et al., Nanoscale Metal/Self-Assembled Monolayer/Metal Heterostructures, American Institute of Physics, pp. 611-613 (1997).
Zhu, X.Y., et al., "Grafting of High-Density Poly(Ethylene Glycol) Monolayers on Si(111)," Langmuir, vol. 17, pp. 7798-7803, 2001.
Zhu, X.Y., et al., "Molecular Assemblies on Silicon Surfaces via Si-O Linkages," Langmuir, vol. 16, pp. 6766-6772, 2000.
Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.
Black et al., Integration of Self-Assembled Diblock Copolymers for Semiconductor Capacitor Fabrication, Applied Physics Letters, vol. 79, No. 3, pp. 409-411 (2001).
Black et al., Polymer Self Assembly in Semiconductor Microelectronics, IBM J. Res. & Dev. vol. 51, No. 5, Sep. 2007, pp. 605-633.
Black, C.T., "Self-aligned self-assembly of multi-nanowire silicon field effect transistors," Appl. Phys. Lett., vol. 87, pp. 163116-1 through 163116-3, 2005.
Black, Charles T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.
Cha et al., Biomimetic Approaches for Fabricating High-Density Nanopatterned Arrays, Chem. Mater. vol. 19, 2007, pp. 839-843.
Chen et al., Highly Ordered Arrays of Mesoporous Silica Nanorods with Tunable Aspect Ratios from Block Copolymer Thin Films, Advanced Materials, vol. 20, pp. 763-767, 2008.
Cho et al., Nanoporous Block Copolymer Micelle/Micelle Multilayer Films with Dual Optical Properties, J. Am. Chem. Soc., vol. 128, No. 30, pp. 9935-9942 (2006).
Clark et al., "Selective Deposition in Multilayer Assembly: SAMs as Molecular Templates," Supramolecular Science, vol. 4, pp. 141-146, (1997).
Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.
Fasolka et al., Block Copolymer Thin Films: Physics and Applications1, Annual Review, vol. 31, pp. 323-355 (2001).
Gates, "Nanofabrication with Molds and Stamps," Materials Today, pp. 44-49, (Feb. 2005).
Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. (2001).
Hadziioannou, Semiconductor Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
Helmuth, Jo A., et al., "High-Speed Microcontact Printing," J. Am. Chem. Soc., vol. 128, No. 29, pp. 9296-9297, 2006.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
International Search Report for International Application No. PCT/US20091062117 dated Jun. 1, 2010, 3 pages.
Ji et al., Molecular Transfer Printing Using Block Copolymers, ACS Nano, vol. 4, No. 2, pp. 599-609, 2010.
Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.
Johnson, Daniel L., et al., "Probing the stability of the disulfide radical intermediate of thioredoxin using direct electrochemistry," Letters in Peptide Science, vol. 10, pp. 495-500, 2003.
Jun, Yongseok, et al., "Microcontact Printing Directly on the Silicon Surface," Langmuir, vol. 18, No. 9, pp. 3415-3417, 2002.
Jun, Yongseok, et al., "Patterning protein molecules on poly(ethylene glycol) coated Si(111)," Biomaterials, vol. 25, pp. 3503-3509, 2004.
Kavakli et al., Single and Double-Layer Antireflection Coatings on Silicon, Turk J Phys, vol. 26, pp. 349-354 (2002).
Kim et al., "Epitaxial self-assembly of block copolymers on lithographically defined nanopatterned substrates", Nature, vol. 24, pp. 411-414, (Jul. 2003).

(56) References Cited

OTHER PUBLICATIONS

Krishnamoorthy et al., Block Copolymer Micelles as Switchable Templates for Nanofabrication, Languir, vol. 22, No. 8, Mar. 17, 2006, pp. 3450-3452.

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.

Lopes et al., Hierarchical Self-Assembly of Metal Nanostructures on Diblock Copolymer Scaffolds, Nature, vol. 414, Dec. 13, 2001, pp. 735-738.

Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.

Malenfant et al., Self-Assembly of an Organic-Inorganic Block Copolymer for Nano-Ordered Ceramics, Nature Nanotechnology, vol. 2, pp. 43-46 (2007).

Niu, Sanjun, et al., "Selective assembly of nanoparticles on block copolymer by surface modification," Nanotechnology, vol. 18, pp. 1-4, 2007.

Park et al., Fabrication of Highly Ordered Silicon Oxide Dots and Stripes from Block Copolymer Thin Films, Advanced Materials, vol. 20, pp. 681-685, 2008.

Park, Sang-Min, et al., "Directed assembly of lamellae-forming block copolymers using chemically and topographically patterned substrates," Advanced Materials, vol. 19, No. 4, pp. 607-611, Feb. 2007.

PCT International Search Report for Application No. PCT/US2008/060520, dated Sep. 11, 2008, 4 pages.

Reed, M.A., et al., "Molecular random access memory cell," Appl. Phys. Lett., vol. 78, No. 23, pp. 3735-3737, Jun. 2001.

Rozkiewicz, Dorota I., et al., "'Click' Chemistry by Microcontact Printing," Angew. Chem. Int. Ed., vol. 45, pp. 5292-5296, 2006.

Ruiz, R., et al., "Induced Orientational Order in Symmetric Diblock Copolymer Thin-Films," Advanced Materials, vol. 19, No. 4, pp. 587-591, (2007).

Sato et al., Novel Antireflective Layer Using Polysilane for Deep Ultraviolet Lithography, J. Vac. Sci. Technol. B, vol. 17, No. 6, pp. 3398-3401 (1999).

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Tadd et al, Spatial Distribution of Cobalt Nanoclusters in Block Copolymers, Langmuir, vol. 18, pp. 2378-2384 (2002). [Published on Web Feb. 8, 2002].

Written Opinion of the International Searching Authority for International Application No. PCT/US2009/062117 dated Jun. 1, 2010, 3 pages.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Chai et al., Assembly of Aligned Linear Metallic Patterns on Silicon, Nature Nanotechnology, vol. 2, Aug. 2007, pp. 500-506.

Chai et al., Using Cylindrical Domains of Block Copolymers to Self-Assemble and Align Metallic Nanowires, ACS Nano, Mar. 2008, vol. 2, No. 3, pp. 489-501.

Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

\* cited by examiner

METHODS OF FORMING SEMICONDUCTOR DEVICE STRUCTURES, AND RELATED STRUCTURES

TECHNICAL FIELD

Embodiments of the present disclosure relate to methods of forming metal structures for semiconductor device structures, to related methods of forming memory cells, and to related semiconductor device structures.

BACKGROUND

Integrated circuits (ICs), the key components in thousands of electronic systems, generally include interconnected networks of electrical components fabricated on a common foundation, or substrate. Metal structures are commonly used to electrically connect semiconductor features, such as capacitors or transistors, or to define a specific IC, such as a computer memory or microprocessor. The deposition and processing methods used to form the metal structures may affect the quality of the metal structures and impact overall manufacturability, performance, and lifetime of the IC. Thus, the methods used to form the metal structures are increasingly determining the limits in performance, density and reliability of integrated circuits.

As a non-limiting example, the deposition and processing methods used to form active electrodes for memory cells of conductive bridging random access memory (CBRAM) devices may greatly affect the performance and reliability of such devices. Memory cells of CBRAM devices conventionally utilize metallic or ionic forms of silver (Ag) or copper (Cu) to form a conductive bridge between an inert electrode and an active electrode. The active electrode serves as the source of the Ag or Cu. The conductive bridge is formed by the drift (e.g., diffusion) of Ag or Cu cations (by application of a voltage across the electrodes) from the active electrode, through an active material of the memory cell, and to the inert electrode, where the Ag or Cu ions are electro-chemically reduced. The conductive bridge may be removed (by applying a voltage with reversed polarity across the electrodes) or may remain in place indefinitely without needing to be electrically refreshed or rewritten.

A problem with the fabrication of CBRAM devices arises due to the difficulty of processing the Ag or Cu. For example, Cu cannot be etched with conventional RIE techniques, and is typically processed in a damascene flow. Also, there are currently no chemical vapor deposition (CVD) or atomic layer deposition (ALD) techniques for Ag. In addition, the ability to deposit Cu and Ag in small openings is limited. Therefore, deposition is conventionally conducted by physical vapor deposition (PVD), which limits the scalability of Ag damascene flows. It is, therefore, currently of interest to minimize the extent of Ag or Cu processing during the integration and fabrication of semiconductor devices, such as CBRAM devices.

Selective deposition techniques are one way of minimizing Ag or Cu processing. In such techniques, pre-patterned chemical specificity enables materials, such as Ag or Cu, to be preferentially deposited only in desired locations, which avoid the need to etch or polish such materials. Electroless plating is a conventional selective deposition technique. However, electroless plating exhibits variability in nucleation and growth rates, which may disadvantageously result in inconsistencies in the volume of metal deposited at each site within a memory array, significantly impacting operations where the quantity of selectively deposited metal must be critically controlled. Electroless plating also requires substrates that are electrochemically active, whereas, in certain semiconductor devices (e.g., MOS devices, MIM devices, and CBRAM devices), it is desirable to selectively deposit materials to substrates that are electrochemically inactive (e.g., dielectric materials). Accordingly, improved methods of forming metal structures for semiconductor devices (e.g., CBRAM devices) using selective deposition techniques are desired, as are related methods of forming memory cells.

DETAILED DESCRIPTION

Figure 1A:
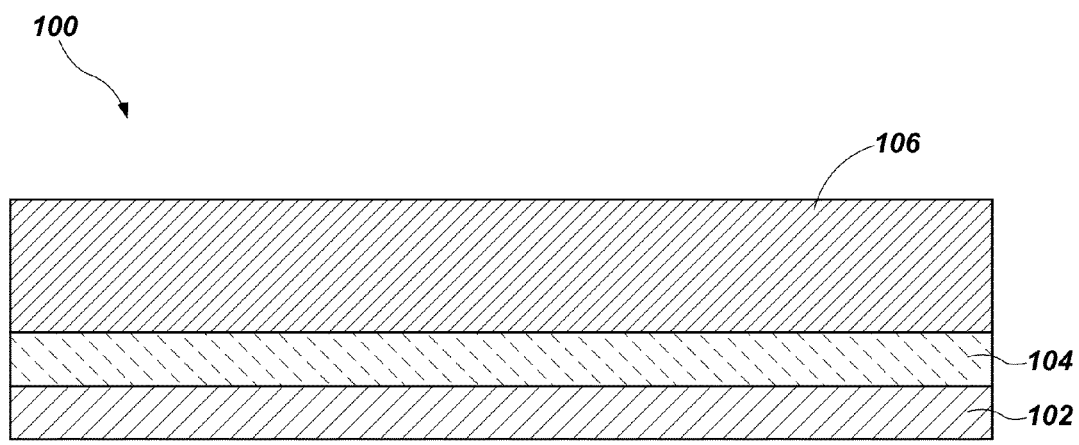
FIGS. 1A through 1E are partial cross-sectional views of a semiconductor structure and illustrate a method of forming a metal structure for a semiconductor device structure in accordance with embodiments of the present disclosure.

Methods of forming metal structures of semiconductor device structures are disclosed, as are related methods of forming memory cells, and related semiconductor device structures. The metal structure is formed from the selective and self-limited deposition of a metal, such as copper (Cu), silver (Ag), or alloys thereof. The metal structure is formed by complexing a metal precursor with a polymer that is configured to react with or couple to the metal precursor and has been applied to predetermined or patterned locations on a semiconductor substrate. The amount of metal precursor complexed with the polymer is limited at least by the amount of metal precursor applied to the polymer and the number of available binding or complexing sites in the polymer. The polymer may be removed and the metal precursor reduced to form the metal structure. By way of example and not limitation, the metal structure may be an electrode or an interconnect. In one embodiment, the metal structure may be used as an active electrode for a memory cell of a conductive bridge random access memory (CBRAM) device. As used herein, the term "active electrode" means and includes a conductive material, such as Cu or Ag, which serves as a source of metal ions (e.g., $Cu^+$, $Ag^+$) for formation of the conductive bridge. The metal structure may also be used as a conductive interface in a via, or as a nucleation site (e.g., a seed material) for subsequent metal deposition, such as electroless deposition. The selective and self-limited metal deposition processes disclosed herein may overcome difficulties with conventional processing of metals (e.g., difficulties processing Cu and Ag, such as difficulties etching and/or depositing Cu and Ag into small structures), decrease the deposition variability of current selective deposition technologies (e.g., electroless plating, autocatalytic deposition), and enable increased performance in semiconductor device structures (e.g., memory cells) and semiconductor devices (e.g., CBRAM devices) that rely on specific and uniform quantities of metal.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided below does not form a complete process flow for manufacturing a semiconductor device. The semiconductor structures described below do not form a complete semiconductor device. Only those process acts and structures necessary to understand the embodiments of the present disclosure are described in detail below. Additional acts to form the complete semiconductor device from the intermediate semiconductor structures may be performed by conventional fabrication techniques. Also note, any drawings accompanying the present application are for illustrative purposes only, and are thus not drawn to scale. Additionally, elements common between figures may retain the same numerical designation.

As used herein, relational terms, such as "first," "second," "over," "top," "bottom," "underlying," etc., are used for clarity and convenience in understanding the disclosure and accompanying drawings and does not connote or depend on any specific preference, orientation, or order, except where the context clearly indicates otherwise.

FIGS. 1A through 1E, are simplified partial cross-sectional views illustrating embodiments of a method of forming at least one metal structure for a semiconductor device structure, such as an active electrode of a memory cell (e.g., for a CBRAM device), a conductive interface in a via, or a nucleation site. Referring to FIG. 1A, semiconductor device structure 100 may include an electrode 102, an active material 104, and a block copolymer material 106. The active material 104 may be formed over and in contact with the first electrode 102, and the block copolymer material 106 may be formed over and in contact with the active material 104.

The electrode 102 may include any suitable conductive material including, but not limited to, a metal, a metal alloy, a conductive metal oxide, or combinations thereof. For example, the first electrode 102 may be formed from tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof. In at least some embodiments, the first electrode 102 is formed from W. The electrode 102 may be formed in, on, or over a substrate (not shown) using conventional techniques, such as chemical vapor deposition (CVD), physical vapor deposition (PVD), or atomic layer deposition (ALD). As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions fondled thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The active material 104 may be a solid state electrolyte material, such as at least one of a chalcogenide compound, a transition metal oxide, and a silicon oxide. As used herein, the term "chalcogenide compound" refers to a binary or multinary compound that includes at least one chalcogen and a more electropositive element or radical. As used herein, the term "chalcogen" refers to an element of Group VI of the Periodic Table, such as oxygen (O), sulfur (S), selenium (Se), or tellurium (Te). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide compound may be a binary, ternary, or quaternary alloy. As used herein, the term "transition metal oxide" means and includes an oxide of an element of Groups VB, VIB, VIIB, VIII, IB, and IIB of the Periodic Table, such as copper oxide (CuO), cobalt oxide (CoO), iron oxide ($Fe_2O_3$), nickel oxide (NiO), magnesium oxide ($MnO_2$), zinc oxide (ZnO), and titanium oxide ($TiO_2$). The silicon oxide may, for example, be silicon dioxide ($SiO_2$). In at least some embodiments, the active material 104 is $SiO_2$. The active material 104 may be formed over and in contact with the electrode 102 using conventional techniques, such as CVD, PVD, or ALD.

As used herein, the term "block copolymer material" means and includes a polymer material including two or more polymer blocks covalently bound to one or more polymer blocks of unlike type. The block copolymer material 106 may be selected based on an ability of at least one polymer block to form a complex with a metal precursor, as described in further detail below. At least one of the polymer blocks may include at least one functional group that is configured to interact with the metal precursor to form the complex. The block copolymer material 106 may be a diblock copolymer material (i.e., copolymer material including two polymer blocks), a triblock copolymer (i.e., a copolymer material including three polymer blocks), or a multiblock copolymer (i.e., a copolymer material including more than three polymer blocks). The different polymer blocks of the block copolymer material may be substantially immiscible in one another. By way of non-limiting example, the block copolymer material 106 may be a diblock copolymer including a hydrophobic block and a hydrophilic block. The hydrophobic block may include a polymer substantially insoluble in a solvent (e.g., an inert polar solvent, such as at least one of water and an organic solvent, such as an alcohol, tetrahydrofuran, and diemthylformamide). The hydrophilic block may include a polymer that swells upon contact with the solvent. In at least some embodiments, the block copolymer material is polystryene-block-poly-2-vinylpryidine (PS-2-P2VP). A ratio of the hydrophilic block to the hydrophobic block may be within a range of from about 80:20 by weight to about 50:50 by weight and, such as about 70:30 by weight. The block copolymer material 106 may be applied over and in contact with the active material 104 by conventional techniques, such as spin casting, spin coating, spraying, ink coating, or dip coating.

Figure 1B:
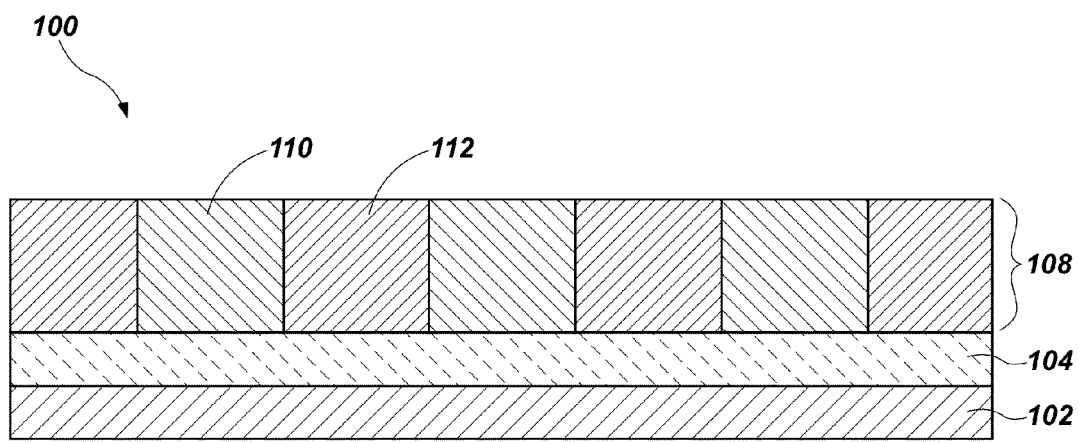

Referring to FIG. 1B, an annealing process may be used to initiate phase separation between polymer blocks of the block copolymer material 106 (FIG. 1A) to form a block copolymer assembly 108 including at least two different domains. The block copolymer assembly 108 may be formed from the block copolymer material 106 (FIG. 1A) by conventional self-assembly techniques, which are not described in detail herein. The at least two different domains may include at least one first domain 110 (e.g., at least one minority domain) and at least one second domain 112 (e.g., at least one majority domain). One or more of the at least one first domain 110 and the at least one second domain 112 may include features (e.g., cylinders, or lamellae) that extend linearly along a direction normal to a planar surface (e.g., top surface) of at least one of the electrode 102 and the active material 104. When the block copolymer material 106 (FIG. 1A) is a diblock copolymer including a hydrophobic block and a hydrophilic block, the at least one first domain 110 may correspond to the hydrophilic block and the at least one second domain 112 may correspond to the hydrophobic block. The annealing process may, for example, include at least one of thermal annealing (e.g., at a temperature greater than the glass transition temperature of the block copolymer material 106 and less than the degradation temperature of the block copolymer material 106), solvent vapor-assisted annealing (e.g., at a temperature greater than or equal to room temperature), and supercritical fluid-assisted annealing. By way of non-limiting example, the block copolymer material 106 may be thermally annealed by exposing the block copolymer material 106 to a temperature within a range of from about 130° C. to about 275° C. in a vacuum or an inert atmosphere (e.g., a nitrogen atmosphere, an argon atmosphere, or combinations thereof).

Figure 1C:
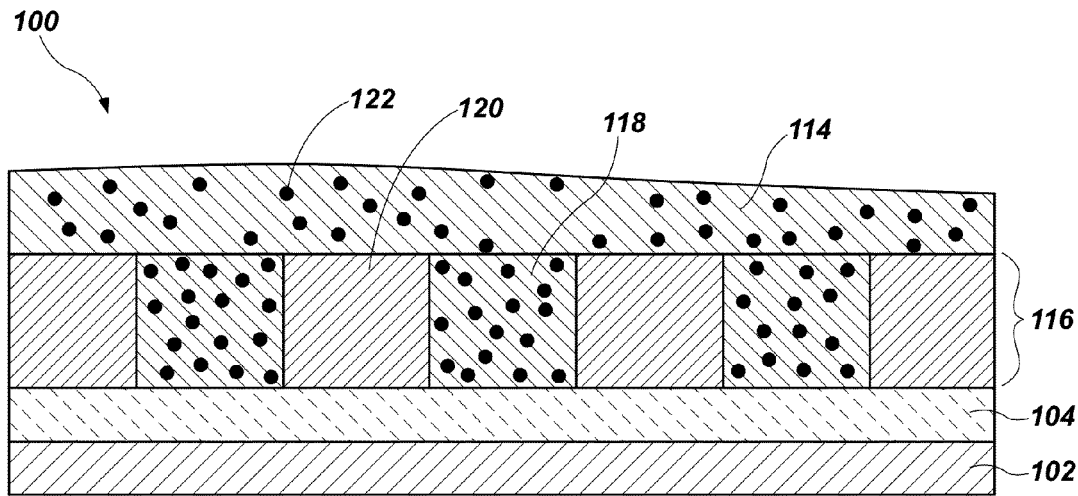

Referring to FIG. 1C, the block copolymer assembly 108 (FIG. 1B) may be exposed to a staining agent 114 to form a metal-complexed block copolymer assembly 116 including at least one metal-complexed domain 118 and at least one non-metal-complexed domain 120. As depicted in FIG. 1C, the at least one first domain 110 (FIG. 1B) may become the at least one metal-complexed domain 118 and the at least one second domain 112 (FIG. 1B) may become the at least one non-metal-complexed domain 120. In additional embodiments, the at least one first domain 110 (FIG. 1B) may become the at least one non-metal-complexed domain 120 and the at least one second domain 112 (FIG. 1B) may become the at least one metal-complexed domain 118.

The staining agent 114 may include at least one metal precursor 122. The at least one metal precursor 122 may be an elemental metal, an elemental metalloid, or a metal-containing compound capable of selectively coupling with the polymer of one or more domain(s) (e.g., the at least one first domain 110 (FIG. 1B)) of the at least two different domains relative to the polymer of one or more other domain(s) (e.g., the at least one second domain 112 (FIG. 1B)) of the at least two different domains. Suitable elemental metals may, for example, include copper, silver, ruthenium, cobalt, nickel, titanium, tungsten, tantalum, molybdenum, platinum, palladium, iridium, gold, and iron. Suitable elemental metalloids may, for example, include silicon, and germanium. Suitable metal-containing compounds may, for example, include metal oxides (e.g., metal alkoxide), and metal salts (e.g., metal halides, metal sulfates, metal cyanides, metal nitrides, and metal nitrates). Optionally, the staining agent 114 may also include at least one solvent. The at least one solvent may be a liquid, gas, or vapor capable of selectively permeating and swelling the one or more domain(s) (e.g., the at least one minority domain 110 (FIG. 1B)) of the at least two different domains relative to the one or more other domain(s) (e.g., the at least one majority domain 112 (FIG. 1B)) of the at least two different domains. In at least some embodiments, the staining agent 114 is a mixture of the metal precursor 122 and at least one solvent.

Exposing the block copolymer assembly 108 (FIG. 1B) to the staining agent 114 may form the metal-complexed block copolymer assembly 116 through at least one of chelation, other ligand interactions, and coulombic interactions. As a non-limiting example, at least where the metal precursor 122 is an elemental metal or an elemental metalloid and the polymer of one or more domain(s) (e.g., the at least one first domain 110 (FIG. 1B)) includes at least one of unsaturated organic groups (i.e., organic groups having π-orbital electrons) and one or more element(s) of Groups VA and VIA of the Periodic table of Elements (e.g., nitrogen, phosphorus, sulfur, and oxygen) in appropriate spacings and orientations, the polymer of the one or more domain(s) may coordinate with the elemental metal or the elemental metalloid (e.g., charge-neutral forms, and charge-positive forms) through chelation and/or other ligand interactions. As an additional non-limiting example, at least where the metal precursor 122 is a metal-containing compound, the metal precursor 122 may be selectively coupled to the polymer of one or more domain(s) (e.g., the at least one minority domain 110 (FIG. 1B)) through coulombic interactions by providing a charge to the polymer of the one or more domain(s) opposing a charge provided to the metal-containing compound. For instance, if the polymer of one or more domain(s) (e.g., the at least one minority domain 110 (FIG. 1B)) includes cationic functionality (e.g., functional groups or constituents that are or may become positively charged, such as pyridine), the staining agent 114 may be an aqueous acid solution including a metal-containing compound including anionic functionality (e.g., functional groups or constituents of the metal-containing compound that are or may become negatively charged). Conversely, if the polymer of one or more domain(s) (e.g., the at least one minority domain 110 (FIG. 1B)) includes anionic functionality (e.g., functional groups or constituents that are or may become negatively charged, such as carboxylic acid groups or thiol groups), the staining agent 114 may be an aqueous base solution including a metal-containing compound including cationic functionality (e.g., functional groups or constituents of the metal-containing compound that are or may become positively charged).

Table 1 below is a non-limiting list of materials and conditions that may be used in combination to form the at least one metal-complexed domain 118 of the metal-complexed block copolymer assembly 116.

TABLE 1

Exemplary Materials and Conditions for
Forming the Metal-Complexed Domain 118

| Domain polymer | Complexation pH | Binding Functionality | Metal precursor |
|---|---|---|---|
| Poly(vinylpyridine) | less than 7 (i.e., acidic) | Pyridinium | Ammonium silver (I) thiosulfate |
| Poly(vinylpyridine) | less than 7 (i.e., acidic) | Pyridinium | Copper (II) chloride |
| Poly((meth)acrylic acid) | greater than 7 (i.e., basic) | Carboxylic acid | Silver (I) nitrate |
| Poly((meth)acrylic acid) | greater than 7 (i.e., basic) | Carboxylic acid | Copper (I) chloride |

In additional embodiments, the block copolymer assembly 108 (FIG. 1B) may be exposed to the solvent and the metal precursor 122 described above in a multiple act process. By way of non-limiting example, the block copolymer assembly 108 (FIG. 1B) may be exposed to the solvent prior to being exposed to the metal precursor 122. Such a multiple act process may be used to provide the at least one minority domain 110 (FIG. 1B) with an exposed surface (e.g., where the at least one minority domain 110 is covered by the majority domain 112), or to at least provide the at least one minority domain 110 (FIG. 1B) with additional surface area for interaction with the metal precursor 122.

Accordingly, a semiconductor device structure of the present disclosure may include an electrode, and at least one metal-complexed structure (e.g., at least one metal-complexed domain) overlying the electrode and including at least one of an elemental metal, an elemental metalloid, a metal oxide, and a metal salt coupled to a polymer including features that extend linearly along a direction normal to a planar surface of the electrode.

Figure 1D:
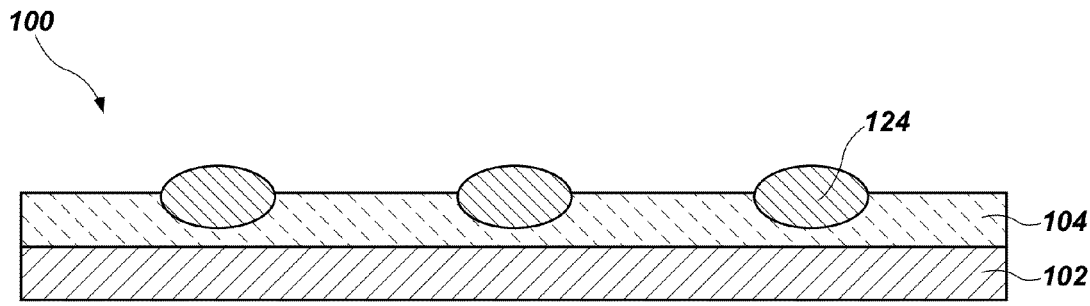

Referring next to FIG. 1D, the polymer of the at least one non-metal-complexed domain 120 may be volatized and removed from the metal-complexed block copolymer assembly 116 (FIG. 1C), and the metal precursor 122 (FIG. 1C) within the at least one metal-complexed domain 118 (FIG. 1C) may be reduced (i.e., chemically reduced) to form at least one metal structure 124 over and in contact with the active layer 104. The at least one metal structure 124 may be formed of a plurality of metal particles (not shown). Each metal particle of the plurality of metal particles may be discontinuous or discrete from each other metal particle of the plurality of metal particles. The polymer may, for example, be volatized and removed by performing a thermal anneal in a reducing atmosphere. The thermal anneal may expose the metal-complexed block copolymer assembly 116 (FIG. 1C) to a temperature greater than or equal to a decomposition temperature of the polymer of each of the at least one metal-complexed domain 118 (FIG. 1C) and the at least one non-metal-complexed domain 120 (FIG. 1C). By way of non-limiting example, the metal-complexed block copolymer assembly 116 may be exposed to a temperature with a range of from about 250° C. to about 750° C. in at least one of an ammonia atmosphere and a hydrogen atmosphere. As shown in FIG. 1D, during the thermal anneal, at least a portion of the metal structure 124 may diffuse into the active layer 104. Conventional processes (e.g., electroless plating) may, optionally, be used to increase the size of the metal particles (not shown) of the at least one metal structure 124.

The metal-complexed block copolymer assembly 116 (FIG. 1C) may, optionally, be exposed to an oxidizing agent (e.g., air, oxygen, nitrogen dioxide, water, nitrous oxide, dinitrogen tetroxide, ozone, or combinations thereof) prior to performing the thermal anneal in the reducing atmosphere described above. Exposure to the oxidizing agent may convert the metal precursor 122 (FIG. 1C) within the at least one metal-complexed domain 118 (FIG. 1C) to a metal oxide (not shown), which may then be reduced to metal by the thermal anneal in the reducing atmosphere. By way of non-limiting example, the semiconductor device structure 100 may be exposed to the oxidizing agent (e.g., ozone) in a sealed chamber at a temperature within a range of from about 25° C. to about 200° C., such as from about 75° C. to about 100° C., for a period of time within a range of from about 30 seconds to about 30 hours, such as from about 30 seconds to about 15 hours, or from about 30 seconds to about 1 hour, or from about 10 minutes to about 1 hour. Exposing the metal-complexed block copolymer assembly 116 (FIG. 1C) to the oxidizing agent prior to performing the thermal anneal in the reducing atmosphere may enable the thermal anneal to be performed at a lower temperature, decreasing aggregation of the metal particles (not shown). In additional embodiments, after exposing the metal-complexed block copolymer assembly 116 (FIG. 1C) to the oxidizing agent, the thermal anneal in the reducing atmosphere may be omitted, leaving a metal-oxide-complexed block copolymer assembly (not shown) including at least one metal-oxide-complexed domain (not shown) and at least one non-metal-oxide-complexed domain (not shown). Polymer of the metal-oxide-complexed block copolymer assembly may be volatilized and removed (e.g., by way of a thermal anneal) to form at least one metal oxide structure.

Accordingly, a method of forming a memory cell may include forming a block copolymer assembly including at least two different domains over an electrode. The at least one metal precursor may be selectively coupled to the block copolymer assembly to form a metal-complexed block copolymer assembly including at least one metal-complexed domain and at least one non-metal-complexed domain. The metal-complexed block copolymer assembly may be annealed to form at least one metal structure.

Figure 1E:
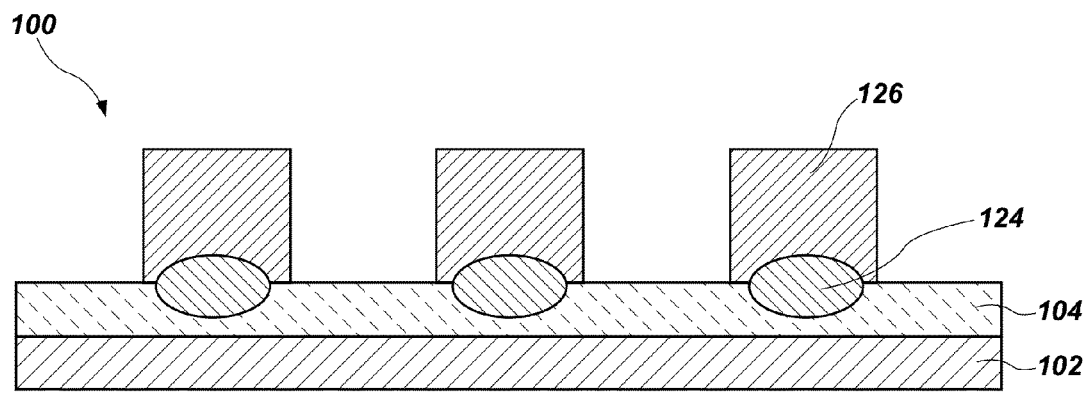

Referring to FIG. 1E, a structure 126, such as an electrode or a contact, may be formed over and in contact with the at least one metal structure 124. The structure 126 may, for example, include a suitable conductive material including, but not limited to, a metal, a metal alloy, a conductive metal oxide, or combinations thereof. By way of non-limiting example, the structure 126 may be formed of W, WN, Ni, TaN, Pt, Ru, Co, CoSi, TiN, TiSiN, TiAlN, or MoN. The structure 126 may be formed of substantially the same material as the electrode 102 or may be a different material than the electrode 102. In at least some embodiments, the structure 126 is formed from W. The structure 126 may be formed over and in contact with the at least one metal structure 124 using conventional deposition (e.g., CVD, ALD, or PVD) and patterning (e.g., masking and etching) techniques.

Figure 2A:
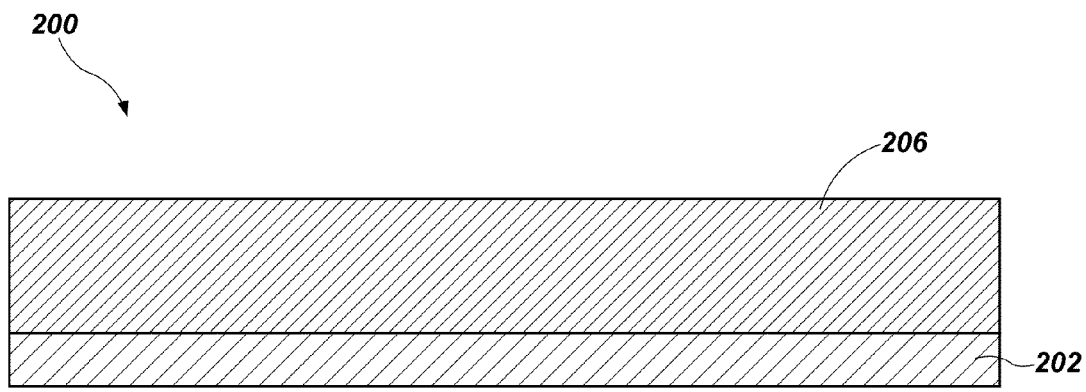
FIGS. 2A-2F are partial cross-sectional views of a semiconductor structure and illustrate another method of forming a metal structure for a semiconductor device structure in accordance with embodiments of the present disclosure.

FIGS. 2A through 2F, are simplified partial cross-sectional views of a semiconductor device structure 200 illustrating embodiments of another method of forming at least one metal structure for a semiconductor device structure, such as an active electrode of a memory cell (e.g., for a CBRAM device), a conductive interface in a via, or a nucleation site. The semiconductor substrate 200 is substantially similar to the semiconductor substrate 100 described above, except that the metal structures are directly formed on an electrode. Referring to FIG. 2A, the semiconductor structure 200 may include an electrode 202, and a block copolymer material 206. The block copolymer material 206 may be formed over and in contact with the electrode 202, which may be formed in, on, or over a substrate (not shown). The electrode 202 and the block copolymer material 206 may be substantially similar to the electrode 102 and the block copolymer material 106 described above, respectively. The electrode 202 and the block copolymer material 206 may be formed in a process substantially similar to that described above to form the electrode 102 and the block copolymer material 106, respectively.

Figure 2B:
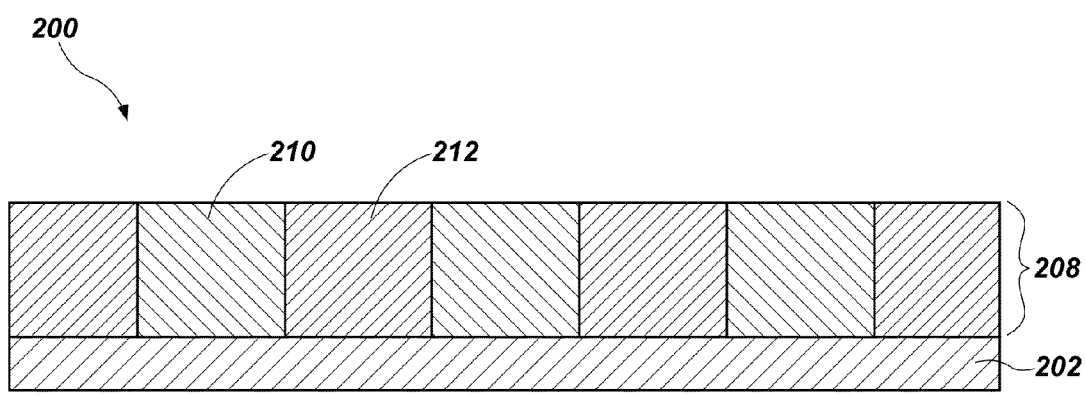
Figure 2C:
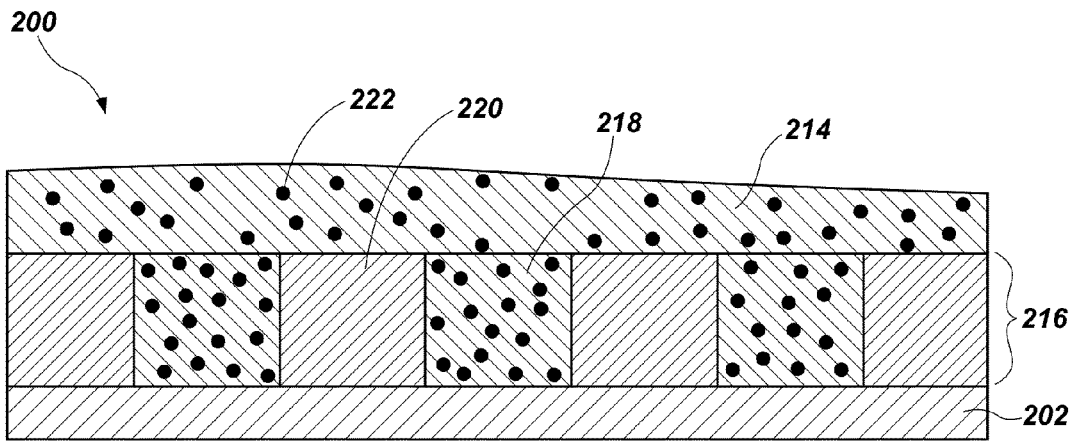

Referring next to FIG. 2B, an annealing process may be used to initiate phase separation between blocks of the block copolymer material 206 to form a block copolymer assembly 208 including at least one minority domain 210 and at least one majority domain 212. The annealing process may be substantially similar to that described above with respect to formation of the block copolymer assembly 108. The block copolymer assembly 208, the at least one first domain 210, and at least one second domain 212 may be substantially similar to the block copolymer assembly 108, the at least one first domain 110, and at least one second domain 112 described above, respectively. As shown in FIG. 2C, the block copolymer assembly 208 (FIG. 2B) may be exposed to a staining agent 214 at least including a metal precursor 222 to form a metal-complexed block copolymer assembly 216 including at least one metal-complexed domain 218 and at least one non-metal-complexed domain 220. The process may be substantially similar to that described above in relation to forming the metal-complexed block copolymer assembly 116. The staining agent 214, the metal-complexed block copolymer assembly 216, the at least one metal-complexed domain 218, and the at least one non-metal-complexed domain 220 may be substantially similar to the staining agent 114, the metal-complexed block copolymer assembly 116, the at least one metal-complexed domain 118, and the at least one non-metal-complexed domain 120 described above, respectively.

Figure 2D:
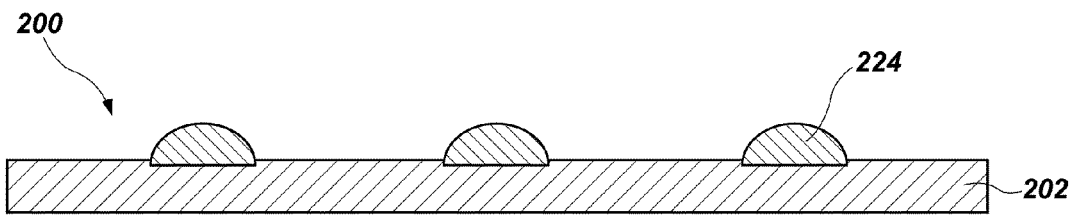

Referring next to FIG. 2D, polymer material may be volatized and removed from the metal-complexed block copolymer assembly 216, and the metal precursor 222 (FIG. 2C) in the at least one metal-complexed domain 218 (FIG. 2C) may be reduced to form at least one metal structure 224 over and in contact with the electrode 202. The at least one metal structure 224 may be formed of a plurality of metal particles (not shown). Each metal particle of the plurality of metal particles may be discontinuous or discrete from each other metal particle of the plurality of metal particles. The process may be substantially similar to that described above in relation to forming the at least one metal structure 124. The at least one metal structure 224 may be substantially similar to the at least one metal structure 124 described above. Conventional processes (e.g., electroless plating) may, optionally, be used to increase the size of the metal particles (not shown) of the at least one metal structure 224.

The metal-complexed block copolymer assembly 216 (FIG. 2C) may, optionally, be exposed to an oxidizing agent before forming the at least one metal structure 224. Exposure to the oxidizing agent may convert the metal precursor 222 (FIG. 1C) within the at least one metal-complexed domain 218 (FIG. 2C) to a metal oxide (not shown), which may then be reduced to metal by thermal anneal in a reducing atmosphere. The process may be substantially similar to that described above in relation to the treatment of the metal-complexed block copolymer assembly 116. In additional embodiments, after exposing the metal-complexed block copolymer assembly 216 (FIG. 1C) to the oxidizing agent, the thermal anneal in the reducing atmosphere may be omitted, leaving a metal-oxide-complexed block copolymer assembly (not shown) including at least one metal-oxide-complexed domain (not shown) and at least one non-metal-oxide-complexed domain (not shown). Polymer of the metal-oxide-complexed block copolymer assembly (not shown) may be volatilized and removed (e.g., by way of a thermal anneal) to form at least one metal oxide structure.

Figure 2E:
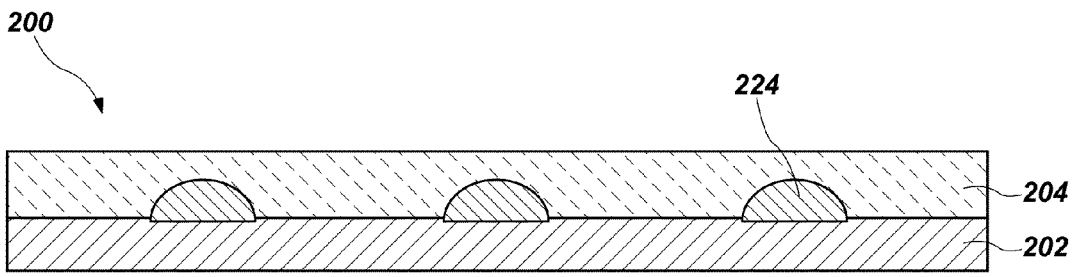
Figure 2F:
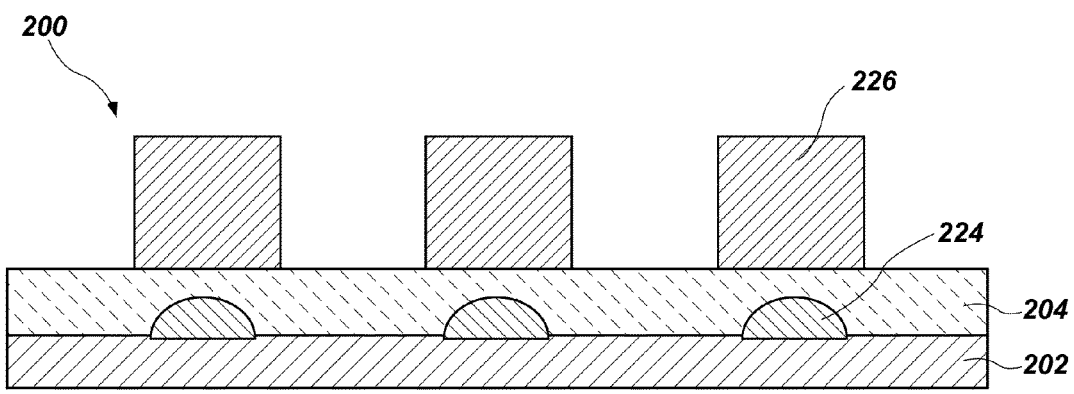

As shown in FIG. 2E, an active material 204 may be formed over and in contact with the at least one metal structure 224 and the electrode 202. The active material 204 may be substantially similar to the active material 104 described above, and may be formed using conventional techniques, such as CVD, PVD, or ALD, which are not described in detail herein. Referring to FIG. 2F, a structure 226, such as an electrode or contact, may be formed over and in contact with the active material 204 at a position overlying the at least one metal structure 224. The structure 226 may be formed using conventional deposition and patterning techniques, which are not described in detail herein. The structure 226 may be substantially similar to the structure 126 described above.

Figure 3A:
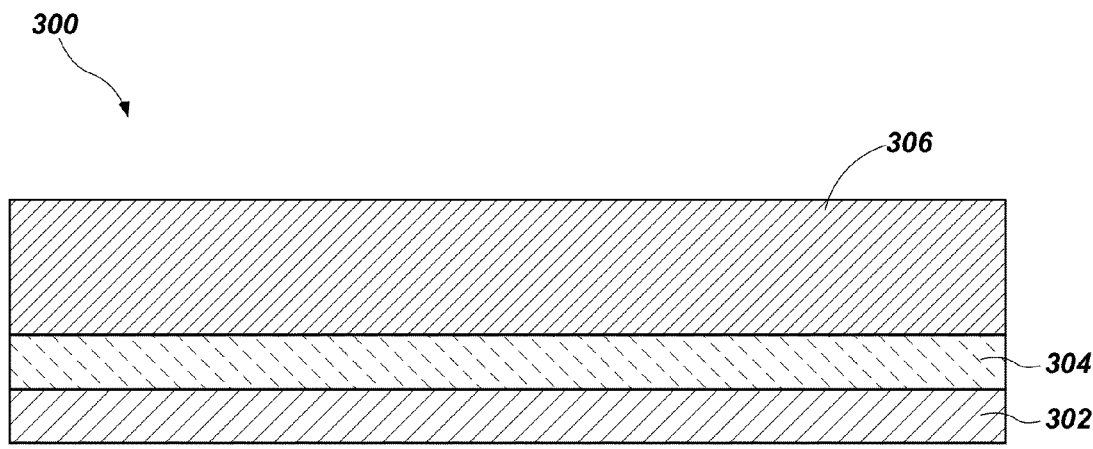
FIGS. 3A-3E are partial cross-sectional views of a semiconductor device structure and illustrate yet another method of forming a metal structure for a semiconductor device structure in accordance with embodiments of the present disclosure.

FIGS. 3A through 3E, are simplified partial cross-sectional views of a semiconductor device structure 300 illustrating embodiments of yet another method of forming at least one metal structure for a semiconductor device structure, such as an active electrode of a memory cell (e.g., for a CBRAM device), a conductive interface in a via, or a nucleation site. Referring to FIG. 3A, the semiconductor device structure 300 may include an electrode 302, an active material 304, and a polymer material 306. The active material 304 may be formed over and in contact with the electrode 302, and the polymer material 306 may be formed over and in contact with the active material 304. The electrode 302 may be formed in, on, or over a substrate (not shown). In additional embodiments, the active material 304 may, at least initially, be omitted, and the polymer material 306 may be formed over and in contact with the electrode 302.

The electrode 302 and the active material 304 may be substantially similar to the electrode 102 and the active material 104 described above, respectively. Each of the electrode 302 and the active material 304 may be formed using conventional techniques, such as PVD, CVD, or ALD. The polymer material 306 may be a homopolymer or a copolymer. As used herein, the term "homopolymer" means and includes a material resulting from the polymerization of a single monomeric species. The polymer material 306 may be capable of forming a complex with a metal precursor. The polymer material 306 may, by way of non-limiting example, be a hydrophilic polymer. In at least some embodiments, the polymer material 306 is poly-2-vinylpyridine (P2VP). The polymer material 306 may be formed over and in contact with the active material 304 by conventional techniques, such as grafting. As a non-limiting example, the polymer material 306 may be prepared with end groups (e.g., hydroxyl groups) that may interact (e.g., by forming covalent bonds) with the active material 304.

Figure 3B:
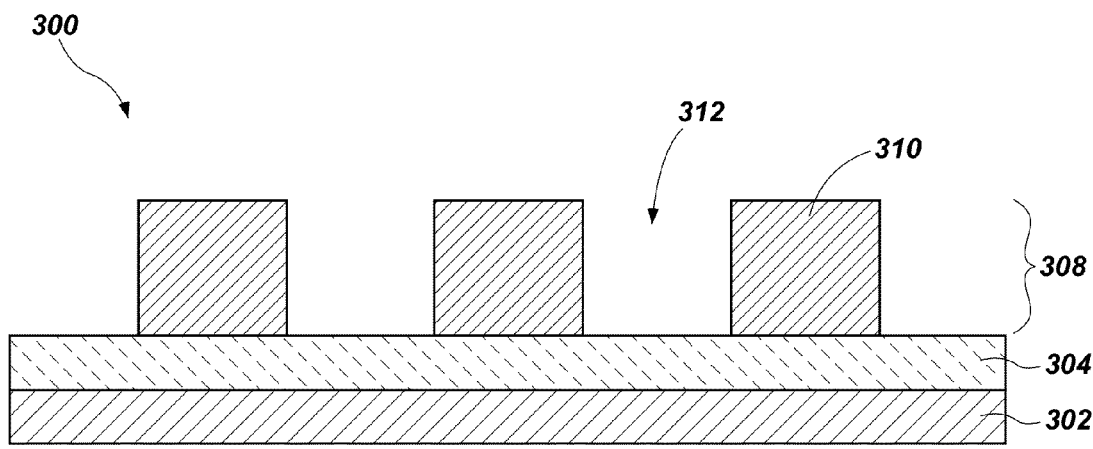

Referring to FIG. 3B, a portion of the polymer material 306 (FIG. 3A) may be selectively removed to form a polymer pattern 308 including at least one polymer structure 310 and at least one opening 312. Removing the portion of the polymer material 306 (FIG. 3A) may expose a surface of the active material 304 or, if the active material 304 is absent, a surface of the electrode 302. The polymer pattern 308 may be formed using conventional techniques. By way of non-limiting example, a resist material (not shown), such as a conventional photoresist or a conventional e-beam resist, may be applied over the polymer material 306 (FIG. 3A) and patterned using appropriate lithography techniques to form a patterned resist (not shown). The pattern defined by the patterned resist (not shown) may be transferred into the polymer material 306 (FIG. 3A) using at least one dry etching process, such as reactive ion etching (RIE), plasma etching, reactive ion beam etching, or chemically assisted ion beam etching. Following the dry etching process, the patterned resist (not shown) may be removed using conventional techniques, such as a solvent strip utilizing a solvent with which the polymer is substantially immiscible. In additional embodiments, the polymer material 306 may be a stainable photoresist including a blend of photoactive species and chemically active species. The photoactive species may enable photoimaging, and the chemically active species may enable staining.

Figure 3C:
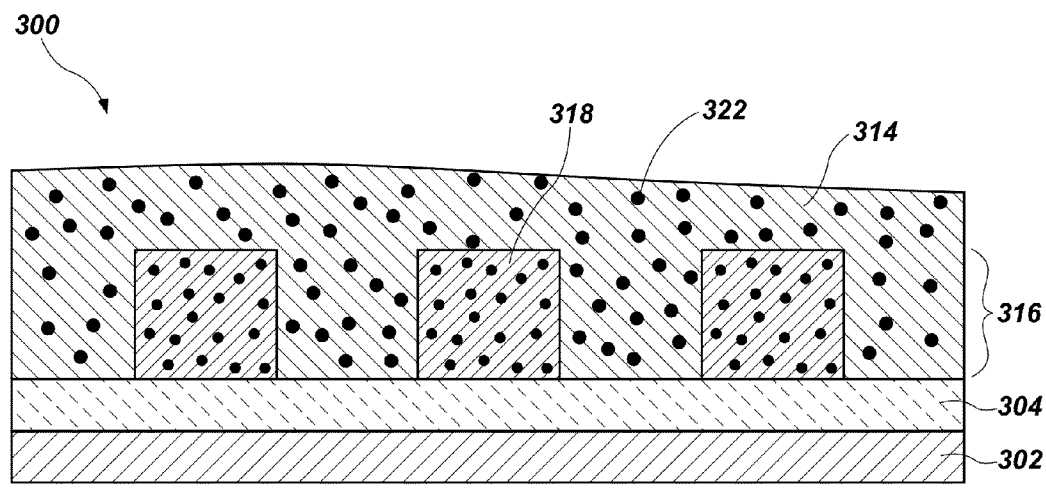

Referring next to FIG. 3C, the polymer pattern 308 (FIG. 3B) may be exposed to a staining agent 314 to form a metal-complexed polymer pattern 316 including at least one metal-complexed polymer structure 318 and the at least one opening 312. The staining agent 314 and process of forming the metal-complexed polymer pattern 316 may be substantially similar to the staining agent 114 and process of forming of the metal-complexed copolymer assembly 116 described above. However, whereas the staining agent 114 may enable the selective coupling of the metal precursor 122 included therein with the polymer of the at least one minority domain 110, the staining agent 314 may enable the selective coupling of metal precursor 322 included therein with the polymer of the at least one polymer structure 310 (FIG. 3B).

Figure 3D:
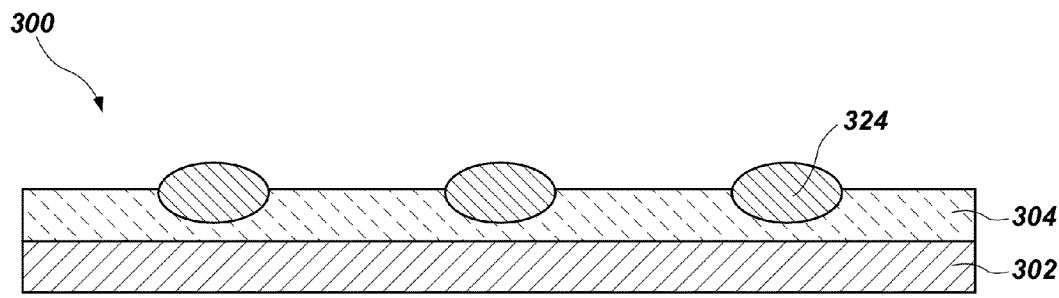

Referring to FIG. 3D, the polymer material may be volatized and removed from the at least one metal-complexed polymer structure 318 (FIG. 3C), and the metal precursor 322 (FIG. 3C) present therein may be reduced to form at least one metal structure 324 over and in contact with the active layer 304. The process may be substantially similar to that described above with respect to the formation of the at least one metal structure 124. The at least one metal structure 324 may be substantially similar to the at least one metal structure 124 described above and may be formed of a plurality of metal particles (not shown). Each metal particle of the plurality of metal particles may be discontinuous or discrete from each other metal particle of the plurality of metal particles. Conventional processes (e.g., electroless plating) may, optionally, used to increase the size of the metal particles (not shown) of the at least one metal structure 324.

The at least one metal-complexed polymer structure 318 (FIG. 3C) may, optionally, be exposed to an oxidizing agent before forming the at least one metal structure 324. Exposure to the oxidizing agent may convert the metal precursor 322 (FIG. 3C) within the at least one metal-complexed polymer structure 318 (FIG. 3C) to a metal oxide (not shown), which may then be reduced to metal by thermal anneal in a reducing atmosphere. The process may be substantially similar to that described above in relation to the treatment of the metal-complexed block copolymer assembly 116. In additional embodiments, after exposing the at least one metal-complexed polymer structure 318 (FIG. 3C) to the oxidizing agent, the thermal anneal in the reducing atmosphere may be omitted, leaving at least one metal-oxide-complexed polymer structure (not shown). Polymer of the metal-oxide-complexed polymer structure (not shown) may be volatilized and removed (e.g., by way of a thermal anneal) to form at least one metal oxide structure.

In additional embodiments, such as where the active material 304 is initially omitted, the at least one metal structure 324 may be formed over and in contact with the electrode 302, in a process substantially similar to that described above in relation to forming the at least one metal structure 224. The active material 304 may then be formed over and in contact with the at least one metal structure 324 and the electrode 302, in a process substantially similar to that described above in relation to forming the active material 204.

Accordingly, a method of forming a memory cell may include forming a polymer material over an electrode. A portion of the polymer material may be removed to form a polymer pattern including at least one polymer structure and at least one opening. The polymer pattern may be exposed to a staining agent to form a metal-complexed polymer pattern including at least one metal-complexed polymer structure. The metal-complexed polymer pattern may be treated to form at least one metal structure.

Figure 3E:
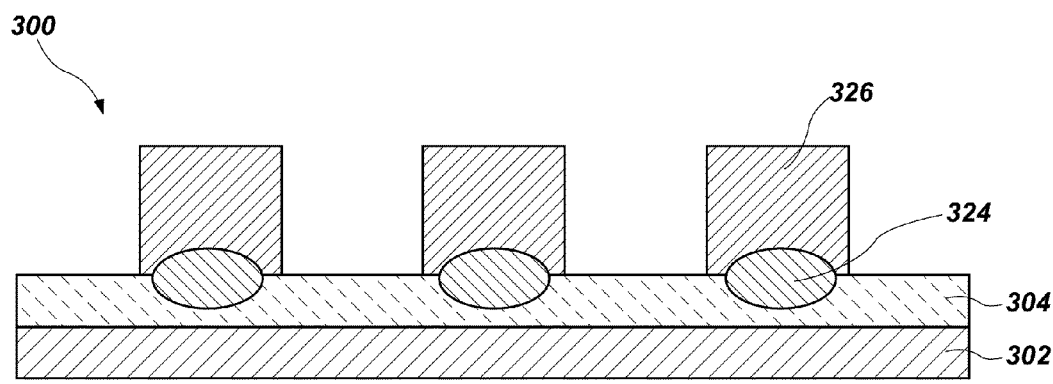

Referring to FIG. 3E, a structure 326, such as an electrode or contact, may be formed over and in contact with the at least one metal structure 324. The structure 326 may be formed using conventional deposition (e.g., CVD, ALD, or PVD) and patterning (e.g., masking and etching) techniques. The structure 326 may be substantially similar to the structure 126 described above. In additional embodiments, such as where the active material 304 is formed over and in contact with the at least one metal structure 324 and the electrode 302, the structure 326 may be formed over and in contact with the active material 304 at a position overlying the at least one metal structure 324, in a process substantially similar to that described above in relation to forming the structure 226.

Figure 4A:
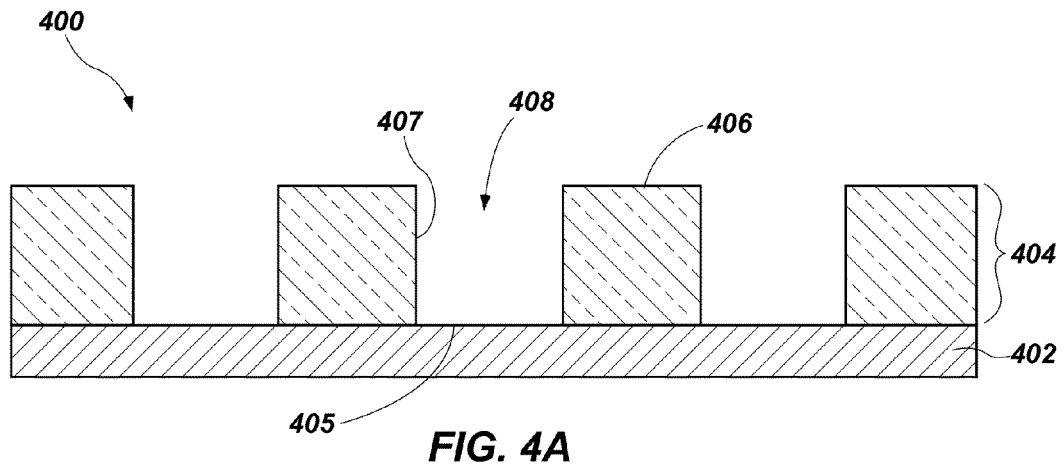
FIGS. 4A-4G are partial cross-sectional views of a semiconductor device structure and illustrate yet still another method of forming a metal structure for a semiconductor device structure in accordance with embodiments of the present disclosure.

FIGS. 4A through 4G, are simplified partial cross-sectional views of a semiconductor device structure 400 illustrating embodiments of yet still another method of forming at least one metal structure for a semiconductor device structure, such as an active electrode of a memory cell (e.g., for a CBRAM device), a conductive interface in a via, or a nucleation site. Referring to FIG. 4A, the semiconductor device structure 400 may include an electrode 402 and a patterned dielectric material 404. The patterned dielectric material 404 may be formed over and in contact with the electrode 402. The electrode 402 may be substantially similar to the electrode 102 described above, and may be formed in, on, or over a substrate (not shown) using conventional techniques, such as PVD, CVD, or ALD. The patterned dielectric material 404 may include at least one dielectric structure 406 and at least one opening 408. The at least one opening 408 may be defined by a surface 405 of the electrode 404 and at least one sidewall 407 of the at least one dielectric structure 406. The at least one dielectric structure 406 may, by way of non-limiting example, include at least one of silicon oxynitride (SiON), silicon nitride ($Si_3N_4$), silicon dioxide ($SiO_2$), another oxide material, and another polymer material. In at least some embodiments, the dielectric structure 406 is formed from $Si_3N_4$. The patterned dielectric material 404 may be formed using conventional deposition and patterning techniques, such as PVD, CVD, or ALD deposition followed by masking and etching. A conformal film of active material (not shown) may, optionally, be formed over and in contact with the patterned dielectric material 404 (e.g., the conformal film of active material may cover surfaces of the at least one dielectric structure 406 and the surface 405 of the electrode 404). If present, the conformal film of active material (not shown) may be substantially similar to the active material 104 described above, and may be formed using conventional techniques, such as PVD, CVD, or ALD.

Figure 4B:
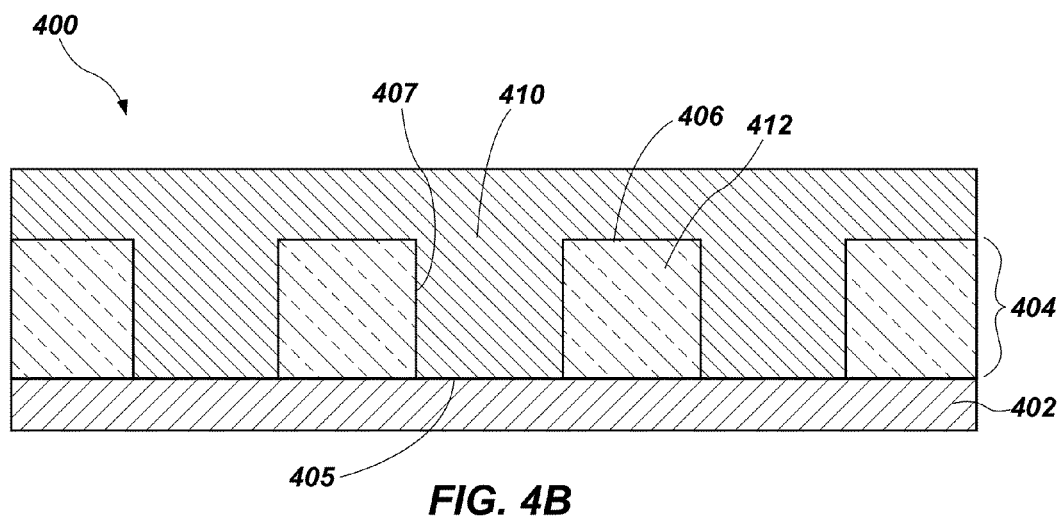

Referring next to FIG. 4B, a polymer material 410 may be formed over and in contact with a surface 412 of the at least one dielectric structure 406, the at least one sidewall 407 of the at least one dielectric structure 406, and the surface 405 of the electrode 404 exposed by the at least one opening 408. The polymer material 410 may cover or encompass the at least one dielectric structure 406 and may at least partially fill the at least one opening 408. In at least some embodiments, the polymer material 410 substantially fills the at least one opening 408. The polymer material 410 may be substantially similar to the polymer material 306 described above. In at least some embodiments, the polymer material 410 is P2VP. The polymer material 410 may be formed over and in contact with the patterned dielectric material 404 by conventional grafting techniques. As a non-limiting example, the polymer material 410 may be prepared with end groups (e.g., hydroxyl groups) that may interact (e.g., by forming covalent bonds) with one or more of the surface 412 of the at least one dielectric structure 406, the at least one sidewall 407 of the at least one dielectric structure 406, and the surface 405 of the electrode 404 exposed by the at least one opening 408.

Figure 4C:
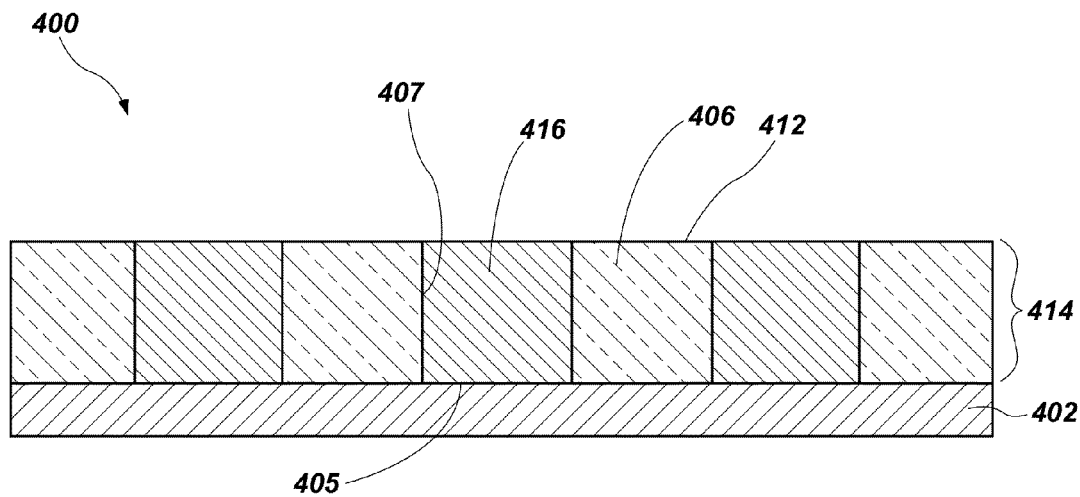

Referring to FIG. 4C, a portion of the polymer material 410 (FIG. 4B) may be removed to expose the surface 412 of the at least one dielectric structure 406 and form an assembly 414 including the at least one dielectric structure 406 and at least one polymer structure 416. The portion of the polymer material 410 (FIG. 4B) may be removed using conventional techniques, such as at least one of an abrasive planarization process (e.g., chemical mechanical planarization), and a suitable etching process (e.g., wet etching, dry etching).

Figure 4D:
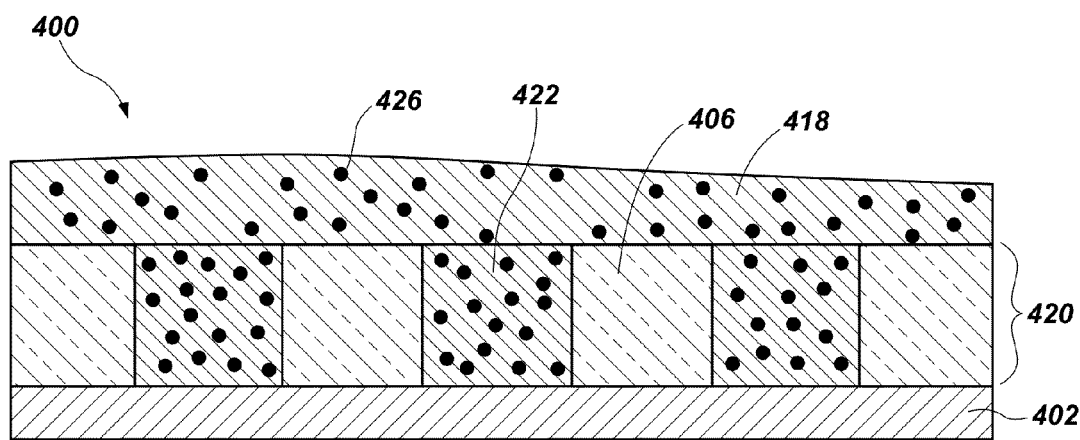

Referring next to FIG. 4D, the assembly 414 (FIG. 4C) may be exposed to a staining agent 418 to form a metal-complexed assembly 420 including at least one metal-complexed polymer structure 422 and the at least one dielectric structure 406 (i.e., a non-metal-complexed structure). The staining agent 418 and process of forming the metal-complexed assembly 420 may be substantially similar to the staining agent 114 and process of forming of the metal-complexed copolymer assembly 116 described above. However, whereas the staining agent 114 may enable selective coupling of the metal precursor 122 included therein with the polymer of the at least one minority domain 110, the staining agent 418 may enable the selective coupling of a metal precursor 426 included therein with the polymer of the at least one polymer structure 416 (FIG. 4C).

In additional embodiments, the polymer material 410 (FIG. 4B) may be exposed to the staining agent 418 to form a metal-complexed polymer material (not shown). A portion of the metal-complexed polymer material may then be removed to form the metal-complexed assembly 420 including the at least one metal-complexed polymer structure 422 and the at least one dielectric structure 406.

Figure 4E:
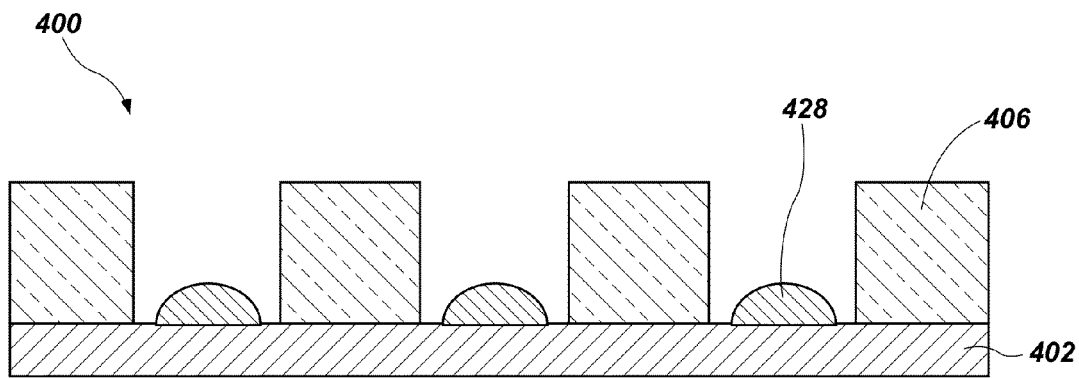

Referring to FIG. 4E, polymer material may be volatized and removed from the at least one metal-complexed polymer structure 422 (FIG. 4D), and the metal precursor 426 (FIG. 4D) present therein may be reduced to form at least one metal structure 428 over and in contact with the electrode 402. The at least one metal structure 428 may be formed from a plurality of metal particles (not shown). Each metal particle of the plurality of metal particles may be discontinuous or discrete from each other metal particle of the plurality of metal particles. The process may be substantially similar to that described above in relation to forming the at least one metal structure 124. However, as depicted in FIG. 4E, the at least one dielectric structure 406 may remain following the process. The at least one metal structure 428 may be substantially similar to the at least one metal structure 124 described above. Conventional processes (e.g., electroless plating) may, optionally, be used to increase the size of the metal particles (not shown) of the at least one metal structure 428.

The at least one metal-complexed polymer structure 422 (FIG. 4D) may, optionally, be exposed to an oxidizing agent before forming the at least one metal structure 428. Exposure to the oxidizing agent may convert the metal precursor 426 (FIG. 4D) within the at least one metal-complexed polymer structure 422 (FIG. 4D) to a metal oxide (not shown), which may then be reduced to metal by thermal anneal in a reducing atmosphere. The process may be substantially similar to that described above in relation to the treatment of the metal-complexed block copolymer assembly 116. In additional embodiments, after exposing the at least one metal-complexed polymer structure 422 (FIG. 4D) to the oxidizing agent, the thermal anneal in the reducing atmosphere may be omitted, leaving at least one metal-oxide-complexed polymer structure (not shown). Polymer of the metal-oxide-complexed polymer structure (not shown) may be volatilized and removed (e.g., by way of a thermal anneal) to form at least one metal oxide structure.

Figure 4F:
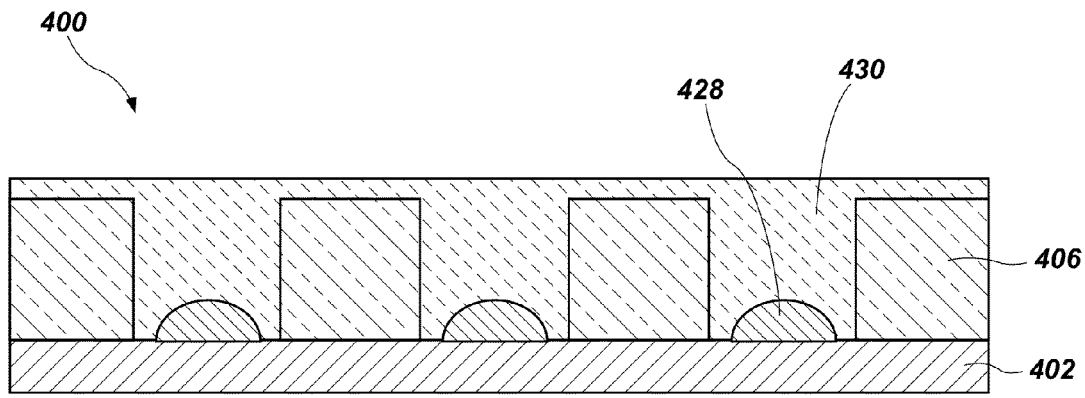
Figure 4G:
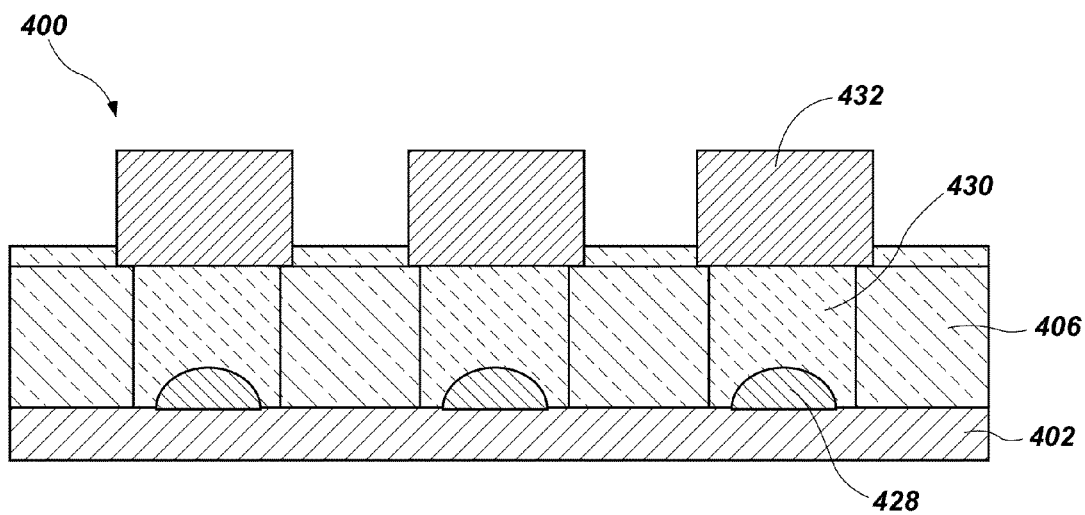

Referring next to FIG. 4F, an active material 430 may be formed over and in contact with the at least one metal structure 428 and the at least one dielectric structure 406. The active material 430 may be formed using conventional techniques, such as CVD, PVD, or ALD. The active material 430 may be substantially similar to the active material 104 described above. In additional embodiments, the active material 430 may be selectively formed over and in contact with the at least one metal structure 428 (e.g., the active material 430 may be selectively grown on the at least one metal structure 428). As shown in FIG. 4G, a structure 432, such as an electrode or contact, may be formed over and in contact with at least a portion of the active material 430 at a position overlying the at least one metal structure 428. The structure 432 may be substantially similar to the second electrode 126 described above, and may be formed using conventional deposition (e.g., CVD, ALD, or PVD) and patterning (e.g., masking and etching) techniques. At least a portion of the structure 432 may also contact the at least one dielectric structure 406.

Figure 5A:
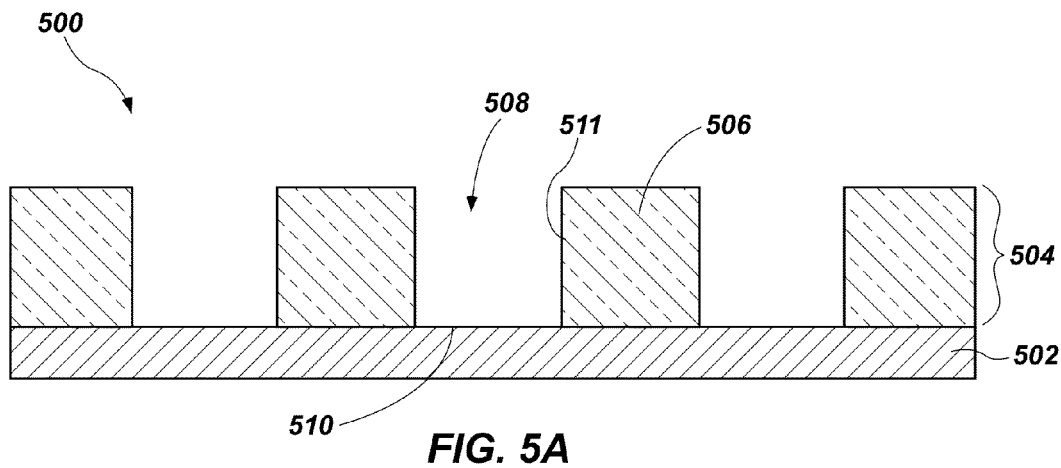
FIGS. 5A-5F are partial cross-sectional views of a semiconductor device structure and illustrate yet still an additional method of forming a metal structure for a semiconductor device structure in accordance with embodiments of the present disclosure.

FIGS. 5A through 5F are simplified partial cross-sectional views of a semiconductor device structure 500 illustrating embodiments of yet still an additional method of forming at least one metal structure for a semiconductor structure, such as an active electrode of a memory cell (e.g., for a CBRAM device), a conductive interface in a via, or a nucleation site. Referring to FIG. 5A, the semiconductor structure 500 include an electrode 502, and a patterned dielectric material 504. The electrode 502 may be a conductive material (e.g., W, WN, Ni, TaN, Pt, Au, TiN, TiSiN, TiAlN, or MoN) that is reactive with a polymer material to be grafted on a surface 510 thereof, as described in further detail below. The patterned dielectric material 504 may include at least one dielectric structure 506 and at least one opening 508. The at least one opening 508 may be defined by the surface 510 of the electrode 502 and at least one sidewall 511 of the dielectric structure 506. The at least one dielectric structure 506 may be a dielectric material (e.g., amorphous carbon) that is non-reactive with the polymer material to be grafted on the surface 510 of electrode 502, as described in further detail below.

Figure 5B:
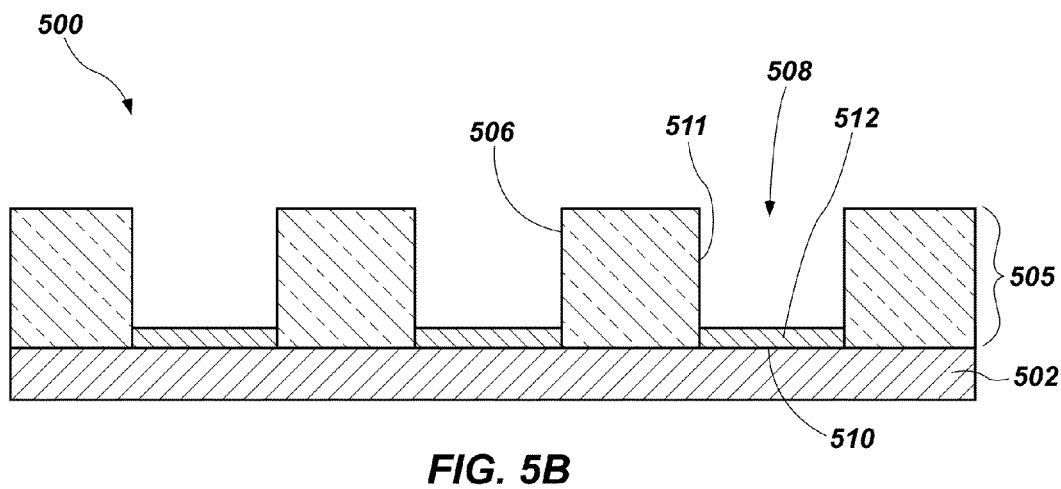

Referring next to FIG. 5B, a polymer material 512 may be selectively grafted over and in contact with the surface 510 of the electrode 502 exposed by the at least one opening 508 to form an assembly 505 including the polymer material 512 and the dielectric structure 506. The polymer material 512 may be substantially similar to the polymer material 306 described above. In at least some embodiments, the polymer material 512 is P2VP. The polymer material 512 may be selectively grafted over and in contact with the portion of the surface 510 by conventional grafting techniques. As a non-limiting example, the polymer material 512 may be prepared with end groups (e.g., hydroxyl groups) that may interact (e.g., by forming covalent bonds) with the surface 510 of the electrode 502. The dielectric structure 506 may be substantially non-reactive with the polymer material 512 such that the polymer material 512 does not become grafted to the at least one sidewall 511 of the dielectric structure 506. A suitable rinse may, optionally, be performed to remove portions of the polymer material 512 not grafted to the surface 510 of the electrode 502.

Figure 5C:
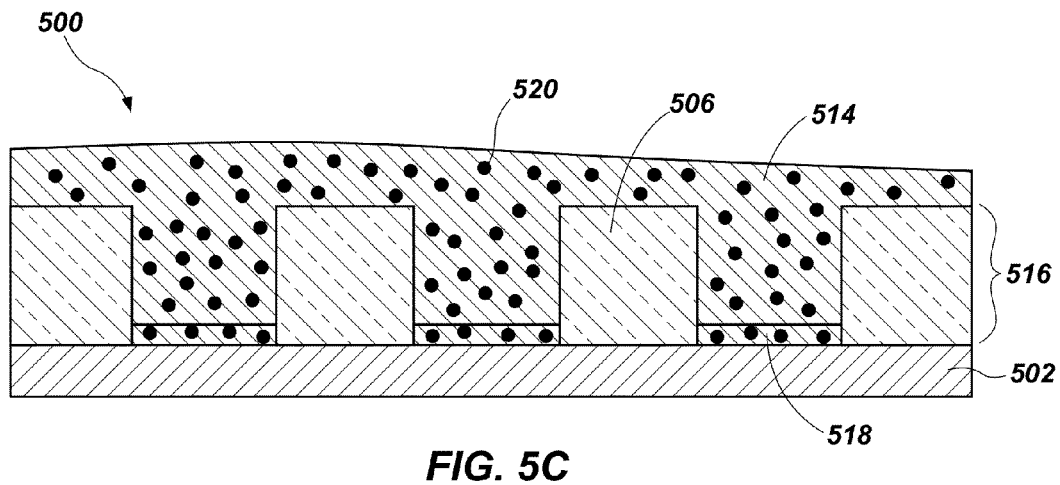

Referring to FIG. 5C, the assembly 505 (FIG. 5B) may be exposed to a staining agent 514 to form a metal-complexed assembly 516 including at least one metal-complexed polymer structure 518 and the at least one dielectric structure 506 (i.e., a non-metal-complexed structure). The staining agent 514 and process of forming the metal-complexed assembly 516 may be substantially similar to the staining agent 114 and process of forming of the metal-complexed copolymer assembly 116 described above. However, whereas the staining agent 114 may enable selective coupling of the metal precursor 122 included therein with the polymer of the at least one minority domain 110, the staining agent 514 may enable the selective coupling of a metal precursor 520 included therein with the polymer of the at least one polymer material 512 (FIG. 5B).

Figure 5D:
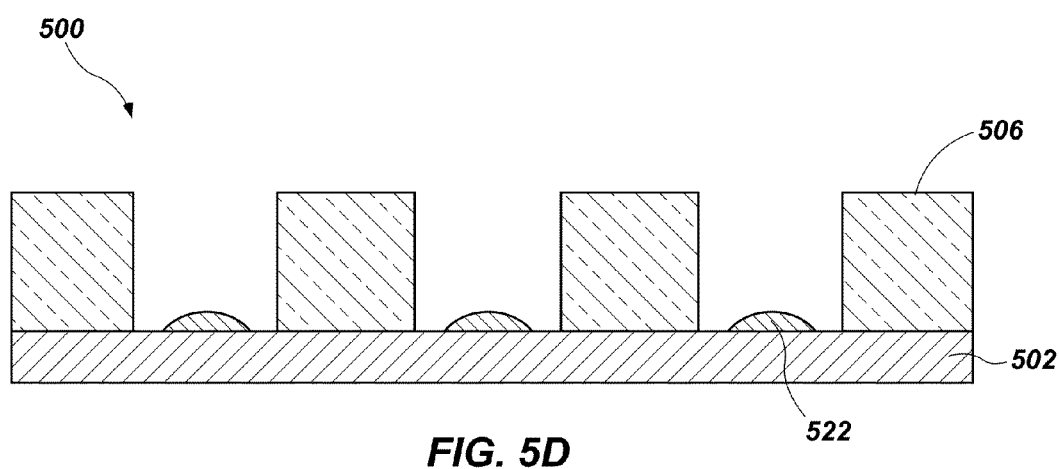

Referring to FIG. 5D, polymer material may be volatized and removed from the at least one metal-complexed polymer structure 518 (FIG. 5C), and the metal precursor 520 (FIG. 5C) present therein may be reduced to form at least one metal structure 522 over and in contact with the electrode 502. The at least one metal structure 522 may include a plurality of metal particles (not shown). Each metal particle of the plurality of metal particles may be discontinuous or discrete from each other metal particle of the plurality of metal particles. Conventional processes (e.g., electroless plating) may, optionally, be used to increase the size of the metal particles (not shown) of the at least one metal structure 522. The process of forming the metal structure 522 may be substantially similar to that described above with respect to the formation the at least one metal structure 124. However, as depicted in FIG. 5D, the at least one dielectric structure 506 may remain following the process.

The at least one metal-complexed polymer structure 518 (FIG. 5C) may, optionally, be exposed to an oxidizing agent before forming the at least one metal structure 522. Exposure to the oxidizing agent may convert the metal precursor 520 (FIG. 5C) within the at least metal-complexed polymer structure 518 (FIG. 5C) to a metal oxide (not shown), which may then be reduced to metal by thermal anneal in a reducing atmosphere. The process may be substantially similar to that described above in relation to the treatment of the metal-complexed block copolymer assembly 116. In additional embodiments, after exposing the at least one metal-complexed polymer structure 518 (FIG. 5C) to the oxidizing agent, the thermal anneal in the reducing atmosphere may be omitted, leaving at least one metal-oxide-complexed polymer structure (not shown). Polymer of the at least one metal-oxide-complexed polymer structure (not shown) may be volatilized and removed (e.g., by way of a thermal anneal) to form at least one metal oxide structure.

Accordingly, a method of forming a memory cell may include forming a patterned dielectric material including at least one dielectric structure and at least one opening over an electrode. A polymer material may be formed over and in contact with at least a surface of the electrode exposed by the at least one opening. The at least one dielectric structure and the polymer material may be exposed to a staining agent to form a metal-complexed assembly including at least one metal-complexed polymer structure. The metal-complexed assembly may be treated to form at least one metal structure.

Figure 5E:
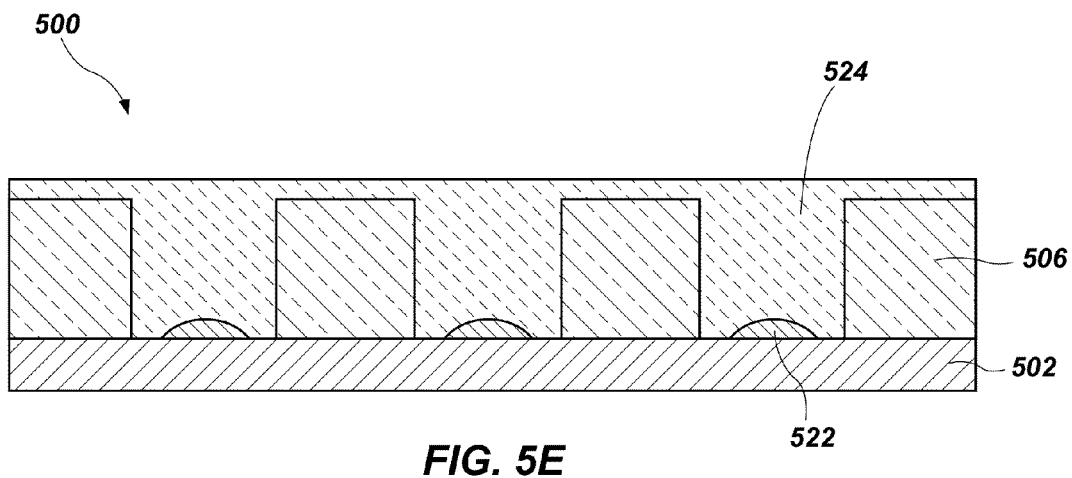
Figure 5F:
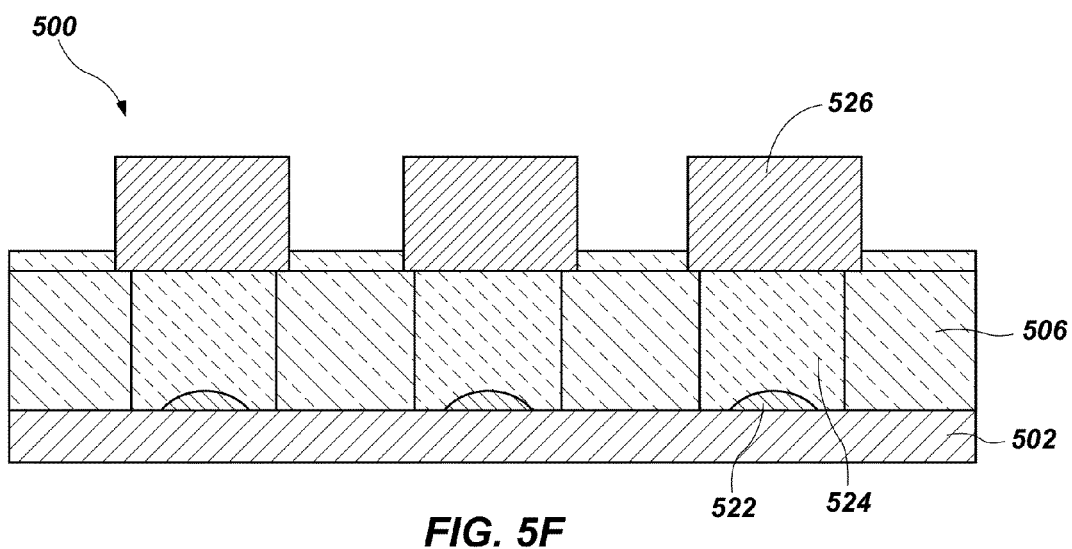

Referring next to FIG. 5E, an active material 524 may be formed over and in contact with the at least one metal structure 522 and the at least one dielectric structure 506. The active material 524 may be formed using conventional techniques, such as CVD, PVD, or ALD. The active material 524 may be substantially similar to the active material 104 described above. In additional embodiments, the at least one dielectric structure 506 may be removed and the active material 524 may be formed over and in contact with the at least one metal structure and the electrode 502. As shown in FIG. 5F, a structure 526, such as an electrode or contact, may be formed over and in contact with at least a portion of the active material 524 at a position overlying the at least one metal structure 522. The structure 526 may be substantially similar to the structure 126 described above, and may be formed using conventional deposition (e.g., CVD, ALD, or PVD) and patterning (e.g., masking and etching) techniques. At least a portion of the structure 526 may also contact the at least one dielectric structure 506, if present.

The methods of the present disclosure advantageously reduce metal processing, decrease material deposition variability relative to conventional selective deposition technologies, such as electroless plating, and enable the formation of semiconductor structures, memory cells, and semiconductor devices that exhibit increased reliability, performance, and durability. In addition, the methods of the present disclosure enable the deposition of material on electrochemically inactive materials (e.g., dielectric materials, such as oxide materials) where conventional selective deposition technologies, such as electroless plating, may be substantially ineffective. Structures (e.g., metal structures, or metal oxide structures) may be formed in desired locations on a substantially planar material (e.g., an electrode (i.e., a conductive material) or an active material), or in openings in a patterned material (e.g., a patterned dielectric material) that overlies a substantially planar material.

The following examples serve to explain embodiments of the present disclosure in more detail. The examples are not to be construed as being exhaustive or exclusive as to the scope of the disclosure.

EXAMPLES

Example 1

Two solutions of 1% P2PV in 10:1 tetrahydrofuran:diemthylformamide were prepared. One solution included 10 wt % copper(II) chloride ($CuCl_2$). The other solution included 2 wt % $CuCl_2$. Coupon samples were prepared by spin-coating the solutions onto a substrate stack including silicon ("Si", 95 Å), a pad oxide layer ("PADOX", 300 Å), nitride (30 Å), and zirconium oxide ("ZrOx"). Samples including each of the above concentrations of $CuCl_2$ were thermally annealed for 10 minutes at 750° C. under an atmosphere of either ammonia ($NH_3$) or 3.8% hydrogen ($H_2$) in argon (Ar) according to Table 2 below.

TABLE 2

Sample Data

| Sample | wt % CuCl$_2$ | Reducing atmosphere |
|---|---|---|
| F | 10 | H$_2$ |
| H | 10 | NH$_3$ |
| J | 2 | H$_2$ |
| L | 2 | NH$_3$ |

Figure 6A:
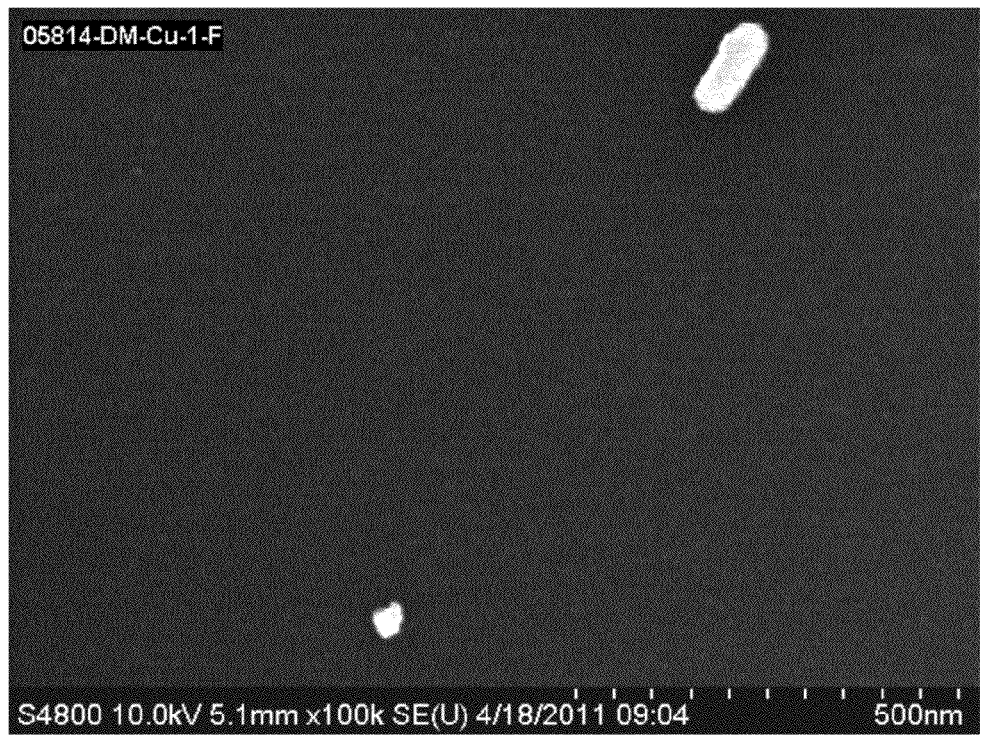
FIG. 6A is a scanning electron micrograph image showing a top-down view of copper particles formed on a semiconductor device structure, as described in Example 1.
Figure 6B:
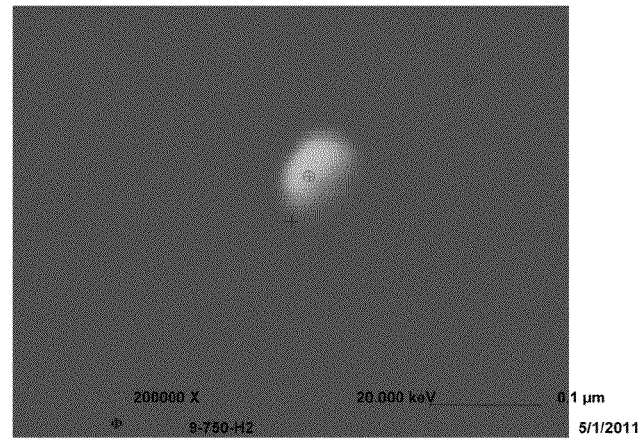
FIG. 6B is a magnified scanning electron micrograph image showing a top-down view of a single copper particle formed on a semiconductor device structure, as described in Example 1.
Figure 7A:
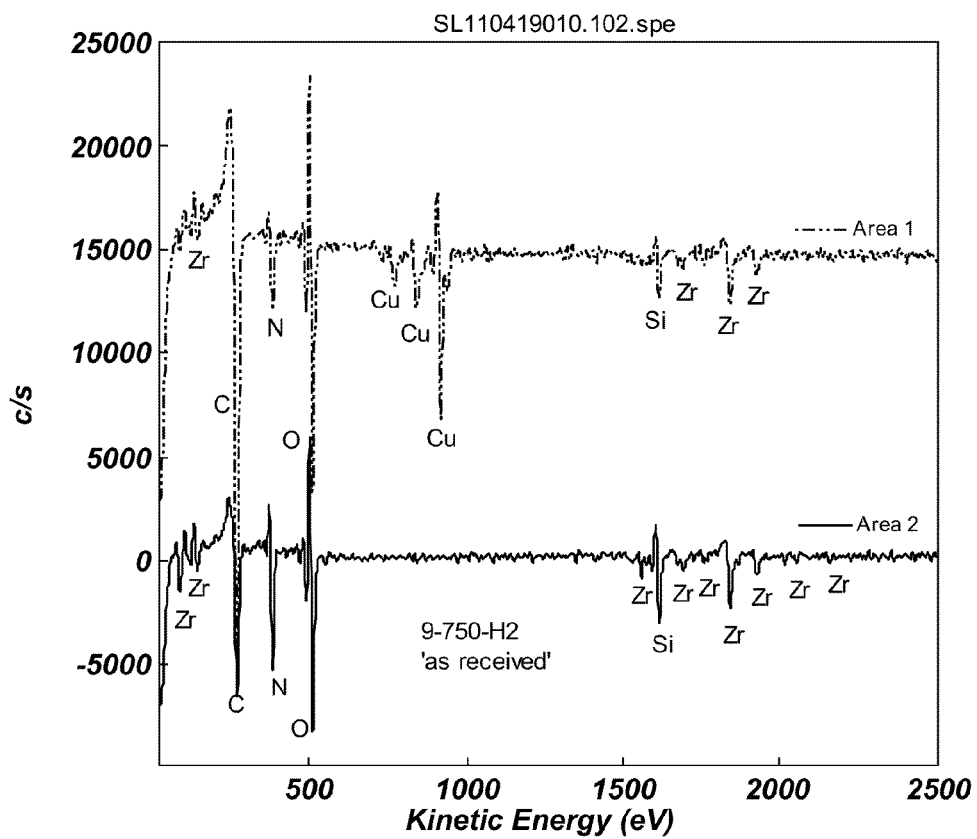
FIG. 7A is a graph of Auger analysis of the single copper particle shown in FIG. 6B, as described in Example 1.
Figure 7B:
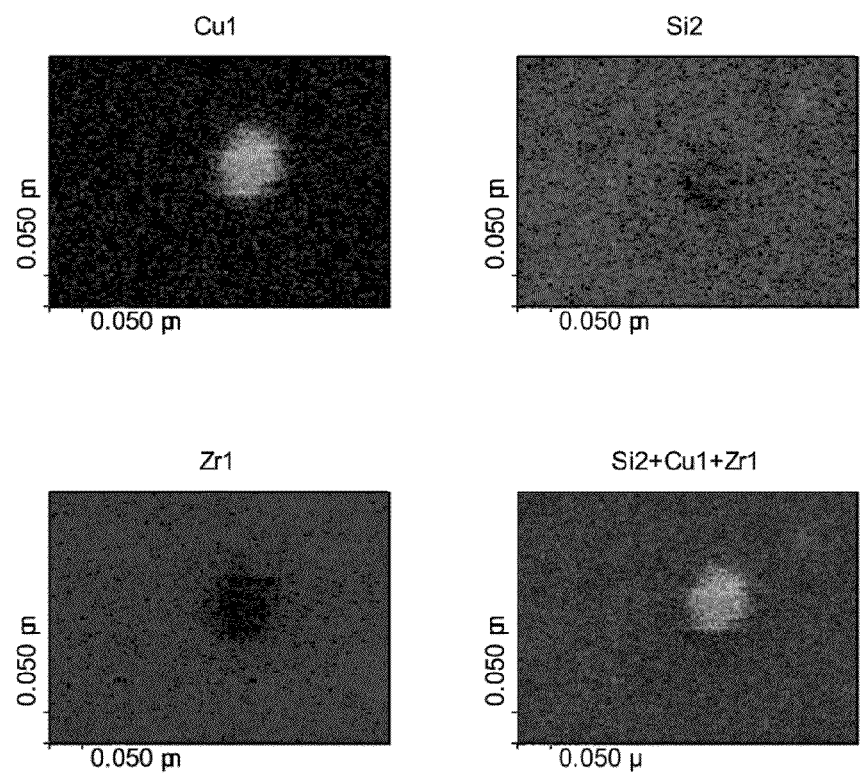
FIG. 7B is an Auger electron map of the single copper particle shown in FIG. 6B, as described in Example 1.

After the thermal anneal the samples were inspected by scanning electron micrograph (SEM), Auger electron spectroscopy, and XPS. SEM imagery of samples F, H, and J showed the formation of white particles. FIG. 6A is a scanning electron micrograph (SEM) image showing a top-down view of white particles formed from the sample F. FIG. 6B is a magnified SEM image showing a top-down view of a single white particle formed from sample F illustrating the two areas used for Auger analysis. The chart of Auger analysis of sample F is shown in FIG. 7A. Particles formed from samples H and J had similar results. An Auger electron map of the white particle shown in FIG. 6B is shown in FIG. 7B. The XPS analysis results are shown in Table 3 below. In Table 3, samples 1, 2, 3, and 4 respectively correspond to samples F, H, J, and L of Table 2. The Auger and XPS analysis results showed that the white particles formed from sample F (i.e., sample 1 in Table 3 below) were copper and had both CuO and either Cu$_2$O or Cu(0) metal composition. No chlorine atoms were detected, indicating that the particles were fully reduced and then subsequently re-oxidized by atmospheric oxygen. The particles formed from samples F, H, J, and L had center diameters ranging from about 50 nm to about 250 nm.

TABLE 3

XPS Analysis Data

Surface elemental concentrations (in atom %)

| Sample | C | N | O | F | So | Zr | Cu(o)/Cu(I) | Cu(II) |
|---|---|---|---|---|---|---|---|---|
| 1 | 14.8 | 8.6 | 49.0 | 0.5 | 8.4 | 16.4 | 0.8 | 1.5 |
| 2 | 39.9 | 3.0 | 32.5 | 10.3 | 3.2 | 11.2 | ND | ND |
| 3 | 16.2 | 7.4 | 49.5 | 0.5 | 8.3 | 18.0 | ND | ND |
| 4 | 32.2 | 2.7 | 44.3 | 0.6 | 7.0 | 13.2 | ND | ND |

Example 2

Two solutions of 1% PS-P2PV in 10:1 tetrahydrofuran:diemthylformamide were prepared. One solution included 10 wt % copper(II) chloride (CuCl$_2$). The other solution included 2 wt % CuCl$_2$. Coupon samples were prepared by spin-coating the solutions onto a substrate stack including Si (95 Å), PADOX (300 Å), nitride (30 Å), and ZrOx. Two samples, one for each of the above concentrations of CuCl$_2$, were thermally annealed for 10 minutes at 750° C. under an atmosphere of 3.8% hydrogen (H$_2$) in argon (Ar).

Figure 8A:
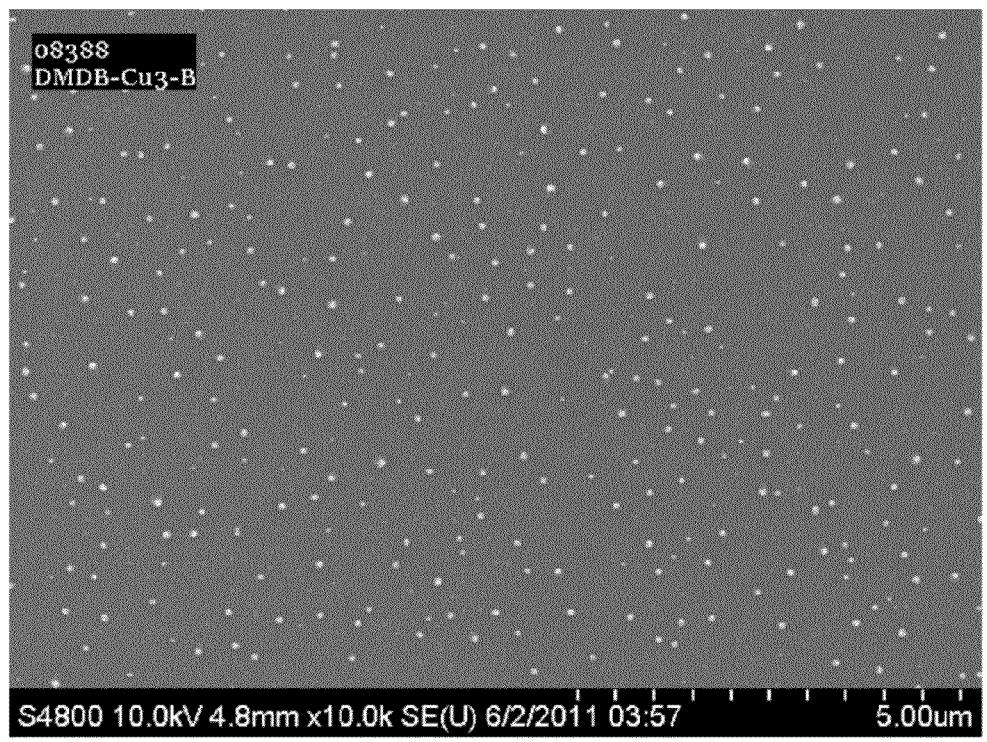
FIG. 8A is a scanning electron micrograph image showing a top-down view of copper particles formed on a semiconductor device structure, as described in Example 2.
Figure 8B:
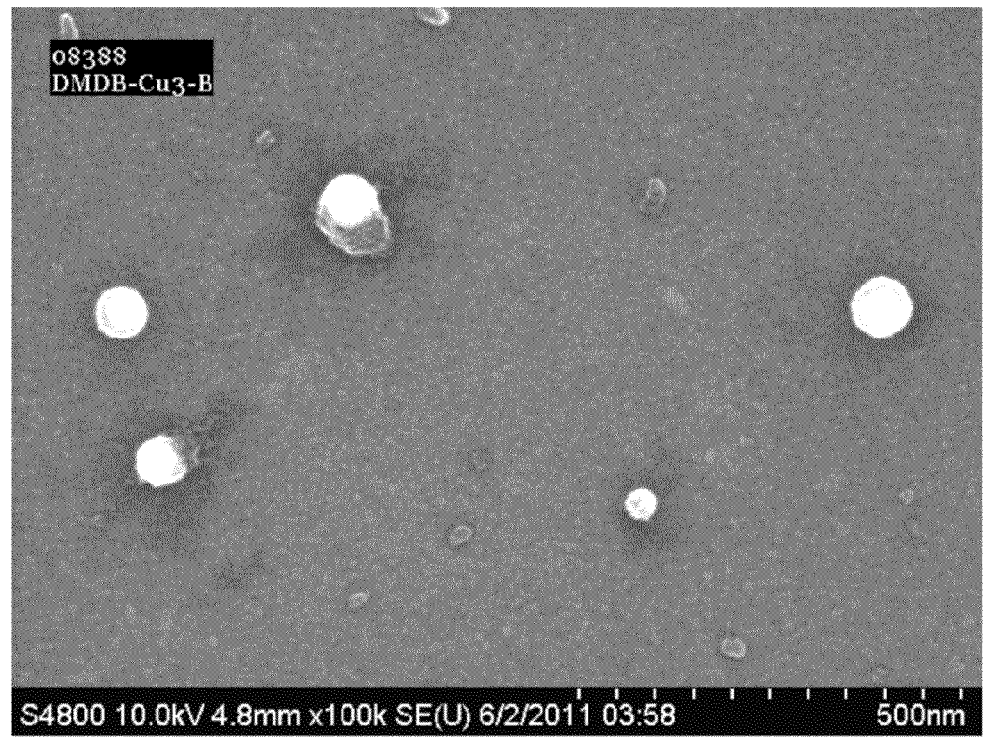
FIG. 8B is a magnified scanning electron micrograph image showing a top-down view of copper particles formed on a semiconductor device structure, as described in Example 2.
Figure 9A:
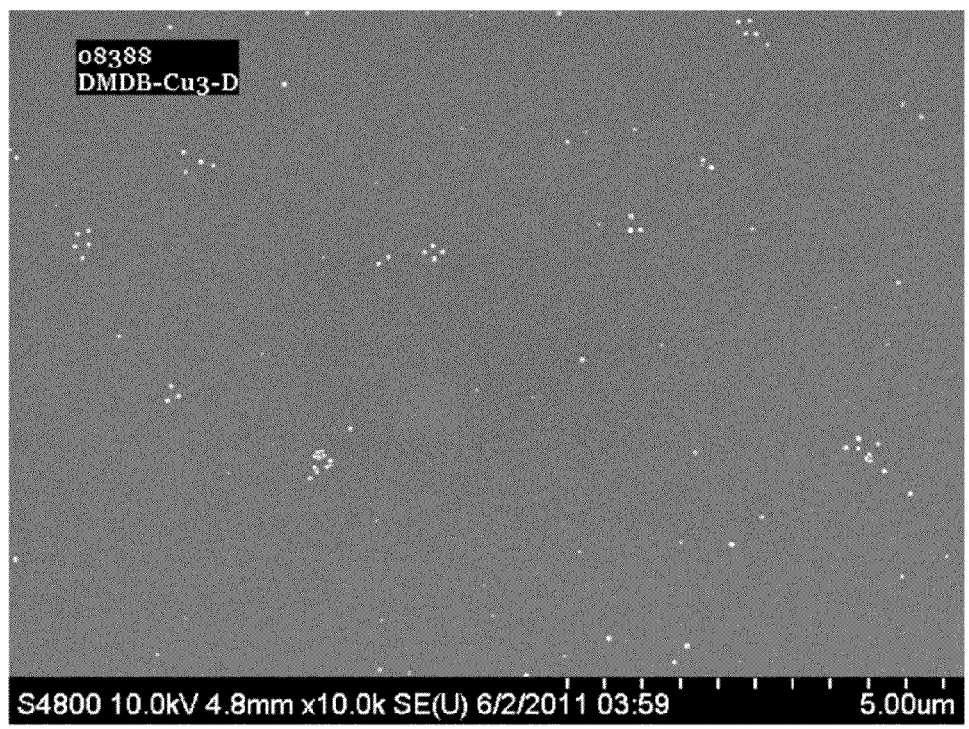
FIG. 9A is a scanning electron micrograph image showing a top-down view of copper particles formed on a semiconductor device structure, as described in Example 2.
Figure 9B:
FIG. 9B is a magnified scanning electron micrograph image showing a top-down view of copper particles formed on a semiconductor structure, as described in Example 2.
Figure 10A:
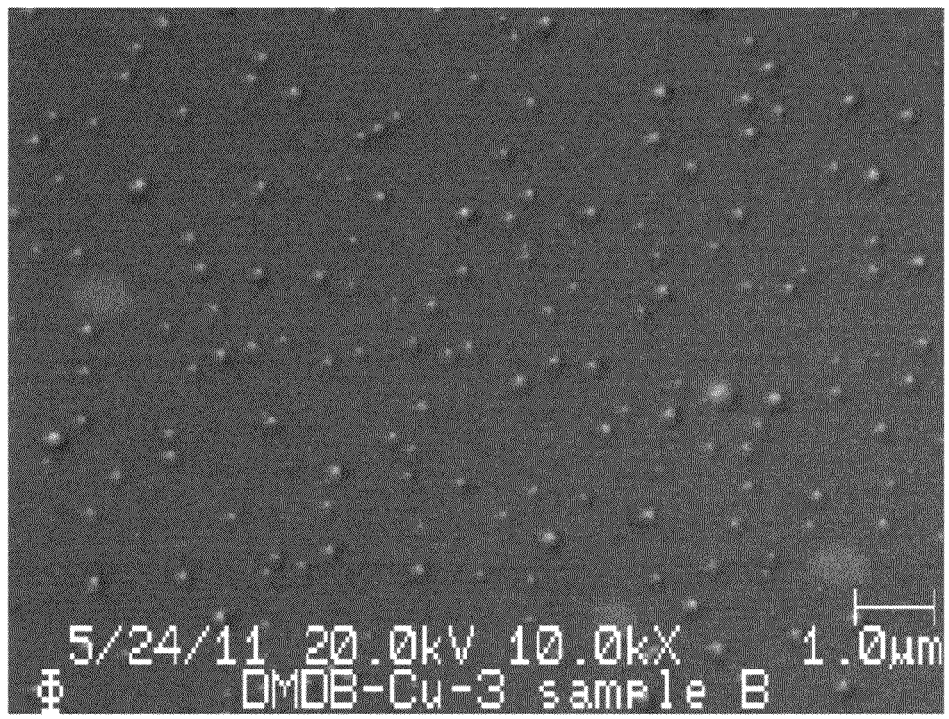
FIG. 10A is a scanning electron micrograph image showing a top-down view of copper particles formed on a semiconductor device structure, as described in Example 2.
Figure 10B:
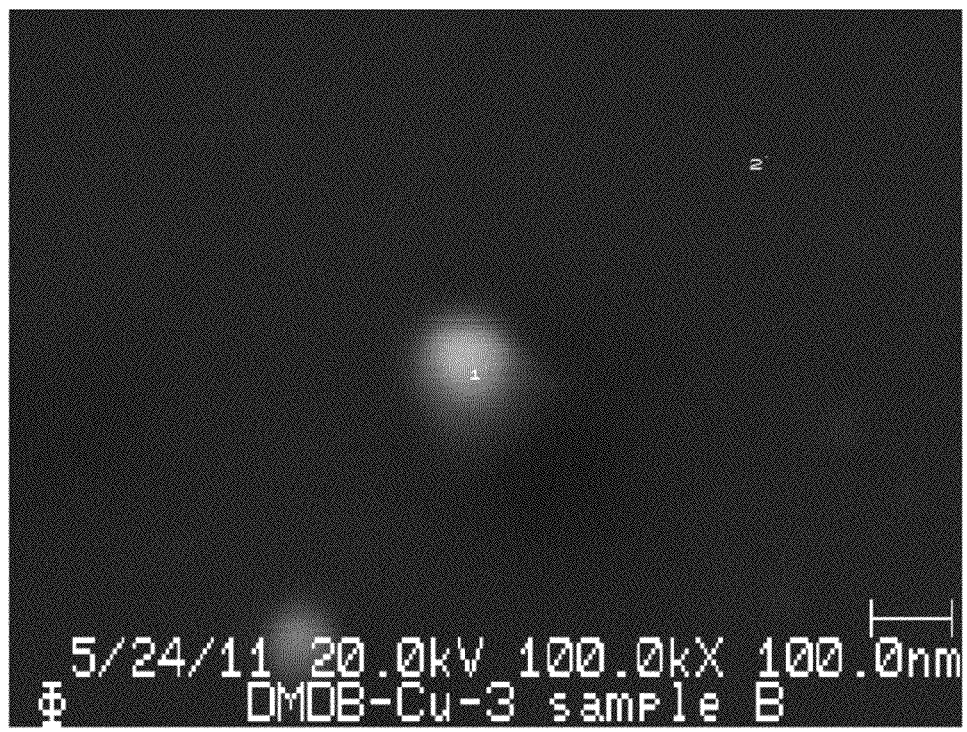
FIG. 10B is a magnified scanning electron micrograph image showing a top-down view of a single copper particle formed on a semiconductor device structure, as described in Example 2.
Figure 11A:
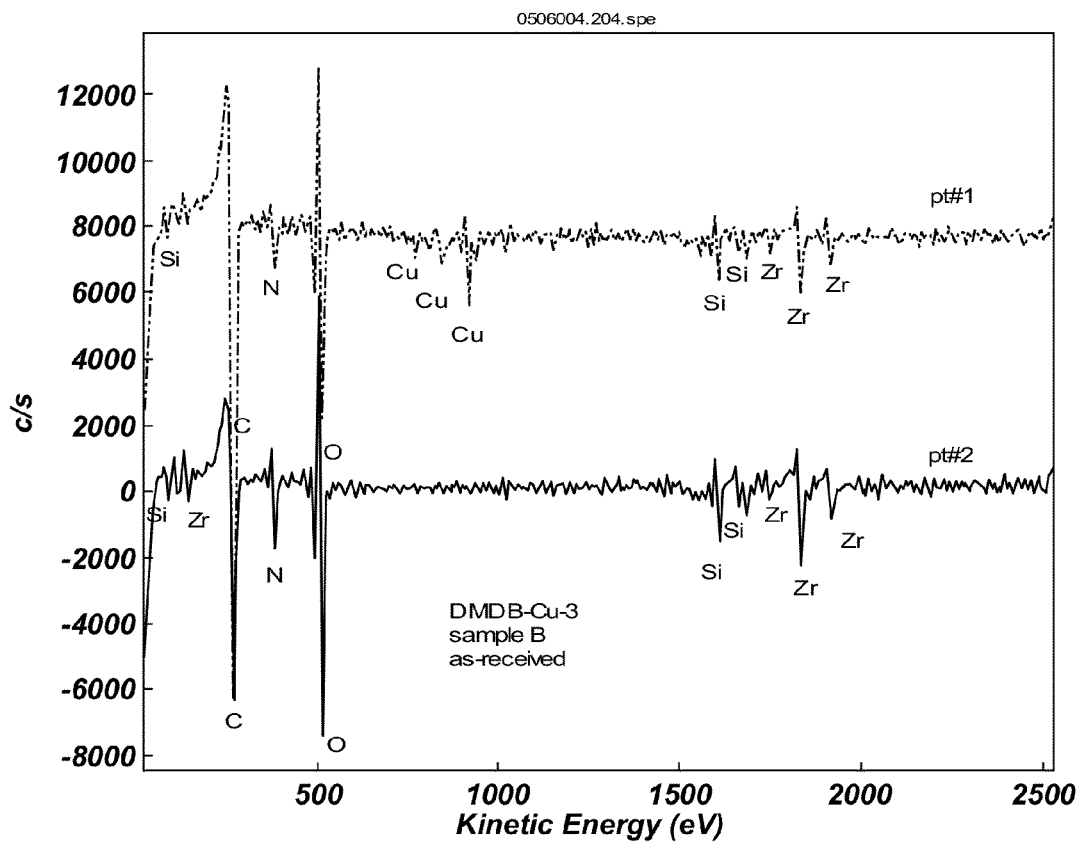
FIG. 11A is a graph of Auger analysis of the single copper particle shown in FIG. 10B, as described in Example 2.
Figure 11B:
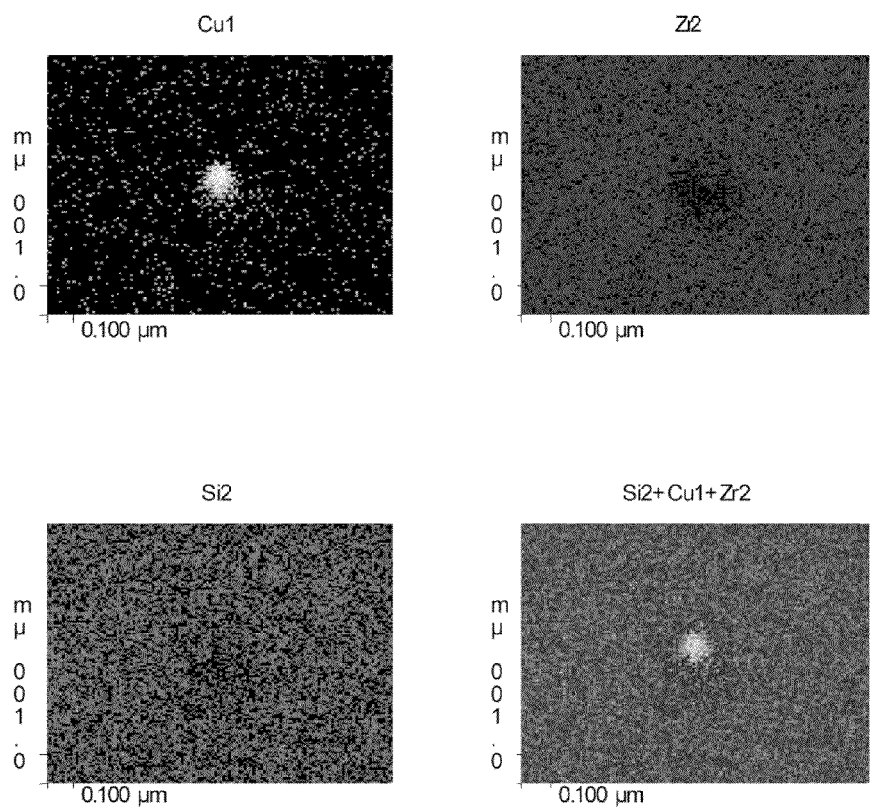
FIG. 11B is an Auger electron map of the single copper particle shown in FIG. 10B, as described in Example 2.

After the thermal anneal the samples was inspected by scanning electron micrograph (SEM) and Auger electron spectroscopy. SEM imagery for each of the sample including 10 wt % CuCl$_2$ loading and the sample including 2 wt % CuCl$_2$ loading show the formation of white particles. FIGS. 8A and 8B are SEM images (i.e., at 10 k and 100 k magnification, respectively) showing a top-down view of the white particles formed from the sample including 10 wt % CuCl$_2$ loading. FIGS. 9A and 9B are SEM images (i.e., at 10 k and 100 k magnification, respectively) showing a top-down view of white particles formed from the sample including 2 wt % CuCl$_2$ loading. The sample including 10 wt % CuCl$_2$ loading exhibited a greater areal density of white particles, and formed particle center diameters ranging from about 20 nm to about 100 nm. The sample including 2 wt % CuCl$_2$ loading exhibited separated clusters of white particles, and formed particle center diameters of about 50 nm. FIG. 10A is a scanning electron micrograph (SEM) image showing a top-down view of white particles formed from a sample B including 2 wt % CuCl$_2$. FIG. 10B is a magnified SEM image showing a top-down view of a single white particle formed from sample B illustrating the two areas used for Auger analysis. The chart of Auger analysis of sample B is shown in FIG. 11A. An Auger electron map of the white particle shown in FIG. 10B is shown in FIG. 11B. The Auger analysis results showed that the white particles formed from sample B were copper.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of forming a semiconductor device structure, comprising:
    forming a block copolymer assembly comprising at least two different domains over an electrode;
    selectively coupling at least one metal precursor to the block copolymer assembly to form a metal-complexed block copolymer assembly comprising at least one metal-complexed domain and at least one non-metal-complexed domain; and
    annealing the metal-complexed block copolymer assembly to form at least one metal structure over the electrode.

2. The method of claim 1, wherein forming a block copolymer assembly comprises:
    applying a block copolymer material comprising at least two different polymer blocks over the electrode; and
    separating the at least two different polymer blocks to form the at least two different domains, each of the domains comprising at least one of the different polymer blocks.

3. The method of claim 1, wherein forming the block copolymer assembly comprises forming the block copolymer assembly such that at least one of the at least two different domains extends linearly along a direction normal to a planar surface of the electrode.

4. The method of claim 1, further comprising forming an active material between the electrode and the block copolymer assembly.

5. The method of claim 1, further comprising forming a structure comprising at least one of a metal, a metal alloy, and a metal oxide over and in contact with the at least one metal structure.

6. The method of claim 1, further comprising:
    forming an active material comprising a solid state electrolyte material over the at least one metal structure and the electrode; and
    forming a structure over the active material at a position overlying the at least one metal structure.

7. The method of claim 1, wherein selectively coupling the at least one metal precursor to the block copolymer assembly comprises exposing the block copolymer assembly to a staining agent comprising a solvent and at least one of an elemental metal, an elemental metalloid, and a metal-containing compound.

8. The method of claim 7, wherein exposing the block copolymer assembly to the staining agent comprises exposing the block copolymer assembly to an aqueous acid solution comprising a metal-containing compound having anionic functionality.

9. The method of claim 8, wherein exposing the block copolymer assembly to the staining agent comprises exposing the block copolymer assembly to an aqueous base solution comprising a metal-containing compound having cationic functionality.

10. The method of claim 1, wherein selectively coupling at least one metal precursor to the block copolymer assembly comprises exposing the block copolymer assembly to a staining agent comprising at least one of a copper compound and a silver compound.

11. The method of claim 1, wherein annealing the metal-complexed block copolymer assembly comprises exposing the metal-complexed block copolymer assembly to a temperature within a range of from about 250° C. to about 750° C. in a reducing atmosphere.

12. The method of claim 1, wherein the at least one metal structure comprises a plurality of metal particles.

13. The method of claim 1, further comprising exposing the metal-complexed block copolymer assembly to an oxidizing agent before annealing the metal-complexed block copolymer assembly.

14. The method of claim 1, wherein forming a block copolymer assembly comprises:
applying a block copolymer material comprising a hydrophilic block and a hydrophobic block over the electrode; and
phase-separating the hydrophilic block and the hydrophobic block to form a hydrophilic domain and a hydrophobic domain.

15. The method of claim 1, wherein forming a block copolymer assembly comprises:
applying polystyrene-block-poly-2-vinylpyridine over the electrode; and
annealing the polystyrene-block-poly-2-vinylpyridine.

16. The method of claim 1, wherein forming a block copolymer assembly comprises forming one of the at least two different domains to have cationic functionality, and wherein selectively coupling at least one metal precursor to the block copolymer assembly comprises exposing the block copolymer assembly to at least one of silver (I) nitrate and copper (I) chloride.

17. The method of claim 1, wherein forming a block copolymer assembly comprises forming one of the at least two different domains to have anionic functionality, and wherein selectively coupling at least one metal precursor to the block copolymer assembly comprises exposing the block copolymer assembly to at least one of ammonium silver (I) thiosulfate and copper (II) chloride.

18. The method of claim 1, wherein selectively coupling the at least one metal precursor to the block copolymer assembly comprises exposing the block copolymer assembly to a staining agent comprising at least one of copper, silver, ruthenium, cobalt, nickel, titanium, tungsten, tantalum, molybdenum, platinum, palladium, iridium, gold, iron, silicon, and germanium.

19. The method of claim 1, wherein annealing the metal-complexed block copolymer assembly comprises exposing the metal-complexed assembly to a reducing atmosphere and a temperature greater than or equal to a decomposition temperature of polymer material of the metal-complexed block copolymer assembly.

20. The method of claim 1, further comprising exposing the metal-complexed block copolymer assembly to at least one of air, oxygen, nitrogen dioxide, water, nitrous oxide, dinitrogen tetroxide, and ozone before annealing the metal-complexed block copolymer assembly.

21. The method of claim 1, further comprising:
forming an active material comprising at least one of a chalcogenide compound, a transition metal oxide, and a silicon oxide on the at least one metal structure and the electrode; and
forming at least one structure on the active material at a position overlying the at least one metal structure.

22. A method of forming a semiconductor device structure, comprising:
forming a block copolymer assembly over an electrode, the block copolymer assembly comprising:
a first domain formulated to interact with a metal precursor through at least one of chelation, other ligand interactions, and coulombic interactions; and
a second domain formulated to not interact with the metal precursor through at least one of chelation, other ligand interactions, and coulombic interactions;
exposing the block copolymer assembly to the metal precursor to form a metal-complexed assembly comprising a metal-complexed domain and a non-metal-complexed domain; and
treating the metal-complexed assembly to form at least one of a metal structure and a metal oxide structure over the electrode.

23. The method of claim 22, wherein forming a block copolymer assembly comprises forming the first domain to comprise unsaturated organic groups and at least one element of Groups VA and VIA of the Periodic Table of Elements.

24. The method of claim 22, wherein forming a block copolymer assembly comprises forming the first domain to comprise a polymer having pyridine functional groups.

25. The method of claim 22, wherein forming a block copolymer assembly comprises forming the first domain to comprise poly(vinylpyridine).

26. The method of claim 22, wherein forming a block copolymer assembly comprises forming the first domain to comprise a polymer having at least one of carboxylic acid groups and thiol groups.

27. The method of claim 22, wherein forming a block copolymer assembly comprises forming the first domain to comprise poly((meth)acrylic acid).

28. The method of claim 22, wherein forming a block copolymer assembly comprises forming the second domain to comprise polystyrene.

29. The method of claim 22, wherein treating the metal-complexed assembly comprises annealing the metal-complexed assembly to form the metal structure over the electrode.

30. The method of claim 22, wherein treating the metal-complexed assembly comprises:
exposing the metal-complexed assembly to an oxidizing agent to form a metal-oxide-complexed block copolymer assembly; and
annealing the metal-oxide-complexed block copolymer assembly to form the metal oxide structure over the electrode.

* * * * *